US011158368B2

(12) United States Patent
Vincent et al.

(10) Patent No.: US 11,158,368 B2
(45) Date of Patent: Oct. 26, 2021

(54) STATIC RANDOM-ACCESS MEMORY CELL DESIGN

(71) Applicant: Coventor, Inc., Cary, NC (US)

(72) Inventors: Benjamin Vincent, Meudon (FR); Joseph Ervin, San Jose, CA (US)

(73) Assignee: Coventor, Inc., Cary, NC (US)

( * ) Notice: Subject to any disclaimer, the term of this patent is extended or adjusted under 35 U.S.C. 154(b) by 0 days.

(21) Appl. No.: 17/012,751

(22) Filed: Sep. 4, 2020

(65) Prior Publication Data

US 2021/0074350 A1    Mar. 11, 2021

Related U.S. Application Data

(60) Provisional application No. 62/896,754, filed on Sep. 6, 2019.

(51) Int. Cl.
*G11C 11/412* (2006.01)
*H01L 27/11* (2006.01)
*G11C 11/417* (2006.01)

(52) U.S. Cl.
CPC .......... *G11C 11/412* (2013.01); *G11C 11/417* (2013.01); *H01L 27/1104* (2013.01)

(58) Field of Classification Search
CPC ................ G11C 11/412; G11C 11/417; H01L 27/1104; H01L 27/0688
USPC ................................................. 365/154, 205
See application file for complete search history.

(56) References Cited

U.S. PATENT DOCUMENTS

| | | | |
|---|---|---|---|
| 2011/0193136 A1* | 8/2011 | Moritoki | H01L 27/10885 257/211 |
| 2011/0199116 A1* | 8/2011 | Or-Bach | H01L 23/49827 326/38 |
| 2011/0222332 A1* | 9/2011 | Liaw | G11C 11/413 365/156 |
| 2011/0263101 A1* | 10/2011 | Appenzeller | H01L 27/1104 438/478 |
| 2011/0266623 A1* | 11/2011 | Han | H01L 27/11 257/347 |
| 2011/0291199 A1* | 12/2011 | Thomas | H01L 21/84 257/369 |
| 2011/0317477 A1* | 12/2011 | Liaw | H01L 27/11 365/156 |
| 2014/0254246 A1* | 9/2014 | Liaw | H01L 29/6681 365/154 |
| 2015/0009750 A1* | 1/2015 | Schaefer | H01L 27/11 365/156 |
| 2019/0164978 A1* | 5/2019 | Chang | H01L 29/0615 |
| 2019/0189195 A1* | 6/2019 | Na | H01L 21/823821 |
| 2019/0198507 A1* | 6/2019 | Nil | H01L 27/0207 |
| 2019/0386062 A1* | 12/2019 | Wang | H01L 43/065 |
| 2020/0058656 A1* | 2/2020 | Guo | H01L 27/0207 |
| 2020/0091156 A1* | 3/2020 | Sharma | H01L 29/78693 |
| 2020/0105767 A1* | 4/2020 | Huang | H01L 27/0924 |
| 2020/0135266 A1* | 4/2020 | Kumar | G11C 11/412 |
| 2020/0135740 A1* | 4/2020 | Liaw | H01L 29/1033 |
| 2020/0168275 A1* | 5/2020 | Bai | G11C 13/0069 |
| 2020/0194058 A1* | 6/2020 | Hsu | H01L 23/528 |

(Continued)

*Primary Examiner* — Michael T Tran

(74) *Attorney, Agent, or Firm* — McCarter & English, LLP; John S. Curran; Nathan D. Harrison

(57) ABSTRACT

A six transistor SRAM memory cell design is discussed. An SRAM memory cell includes criss-crossed transistors in cross-coupled inverters to achieve a more compact form factor and simplify fabrication.

17 Claims, 44 Drawing Sheets

(56) References Cited

U.S. PATENT DOCUMENTS

| | | | |
|---|---|---|---|
| 2020/0212291 A1* | 7/2020 | Lin | H01F 10/3218 |
| 2020/0235246 A1* | 7/2020 | Sharma | H01L 29/0669 |
| 2020/0279847 A1* | 9/2020 | Pillarisetty | H01L 21/823821 |
| 2020/0357782 A1* | 11/2020 | Karpov | H01L 25/0657 |

* cited by examiner

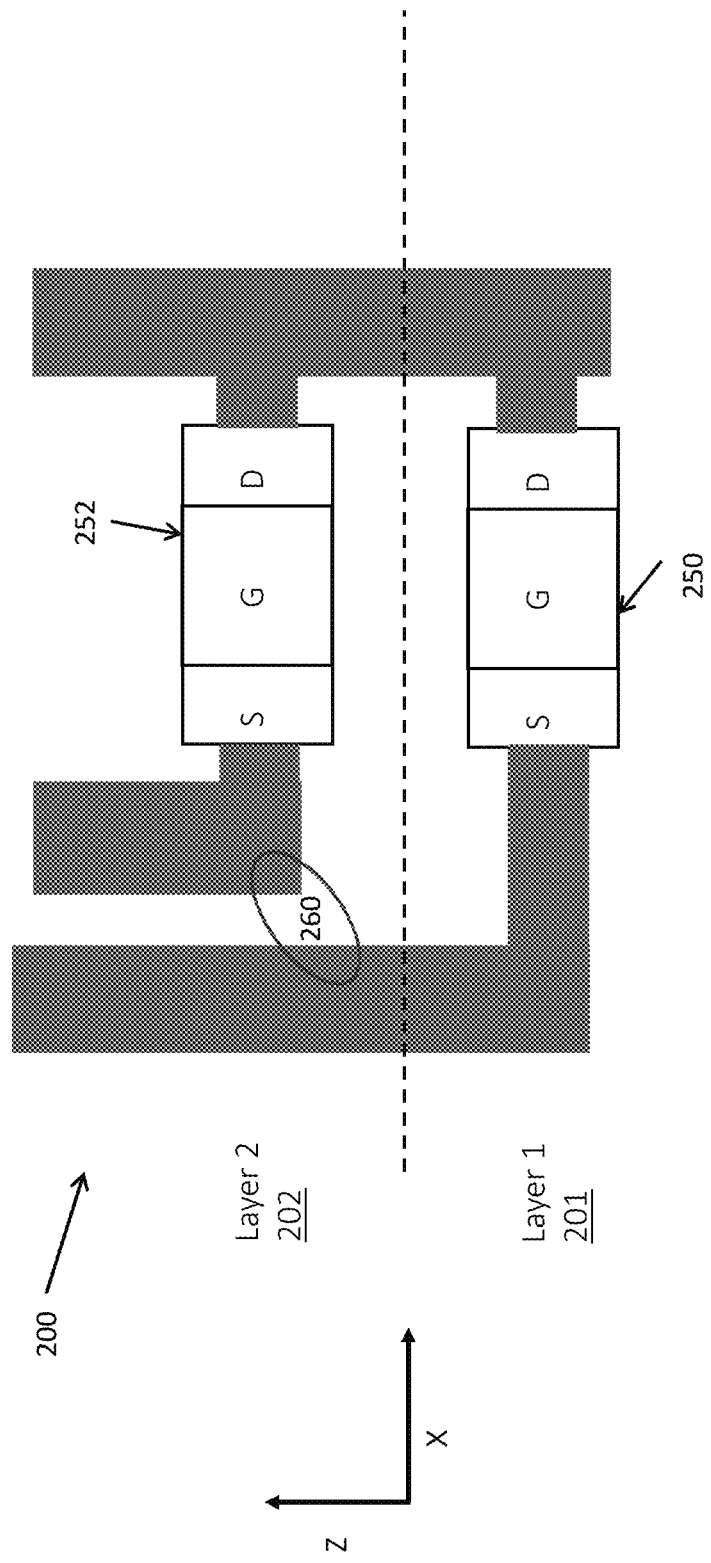

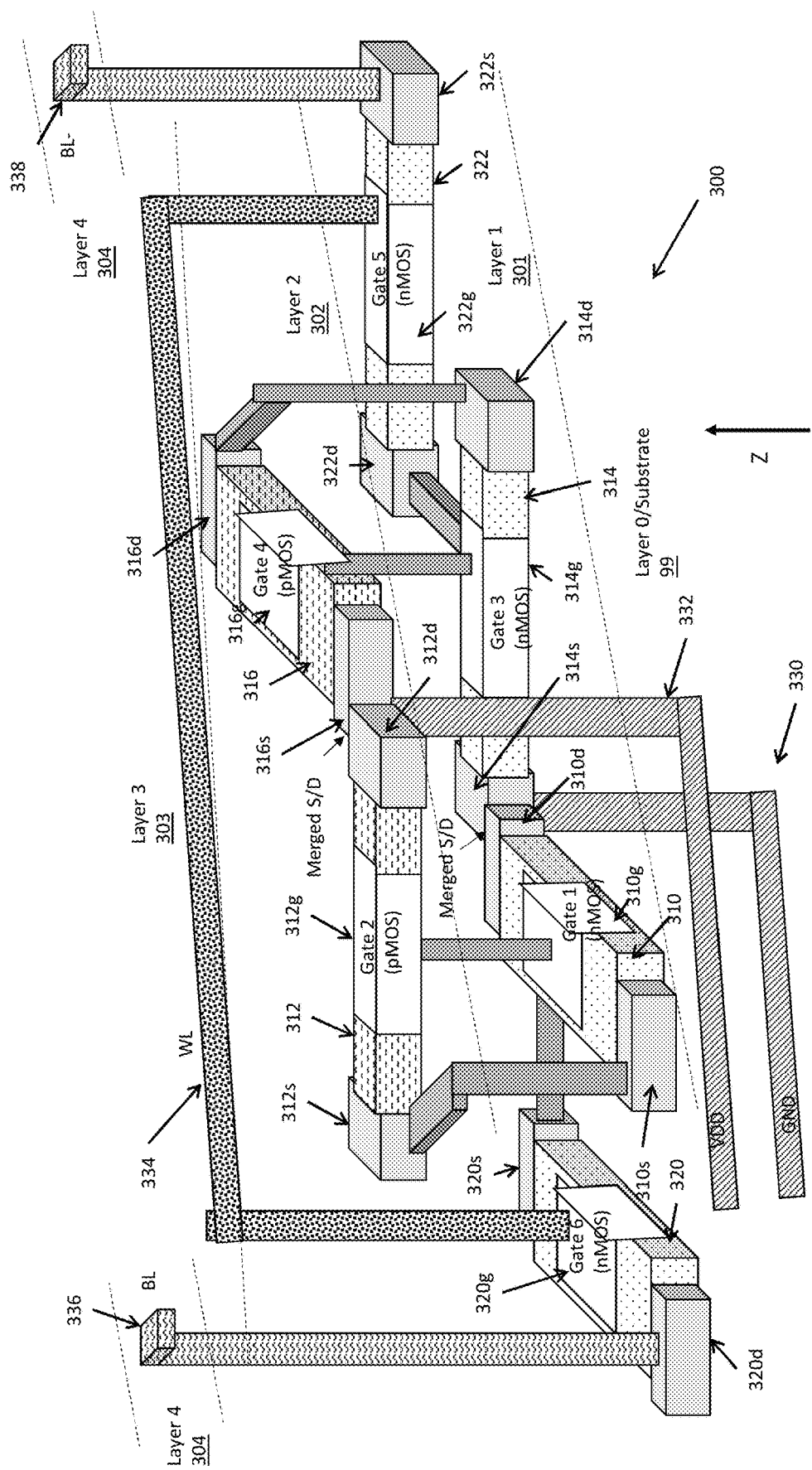

1002

1202

1302

1402

1502

1602

2002

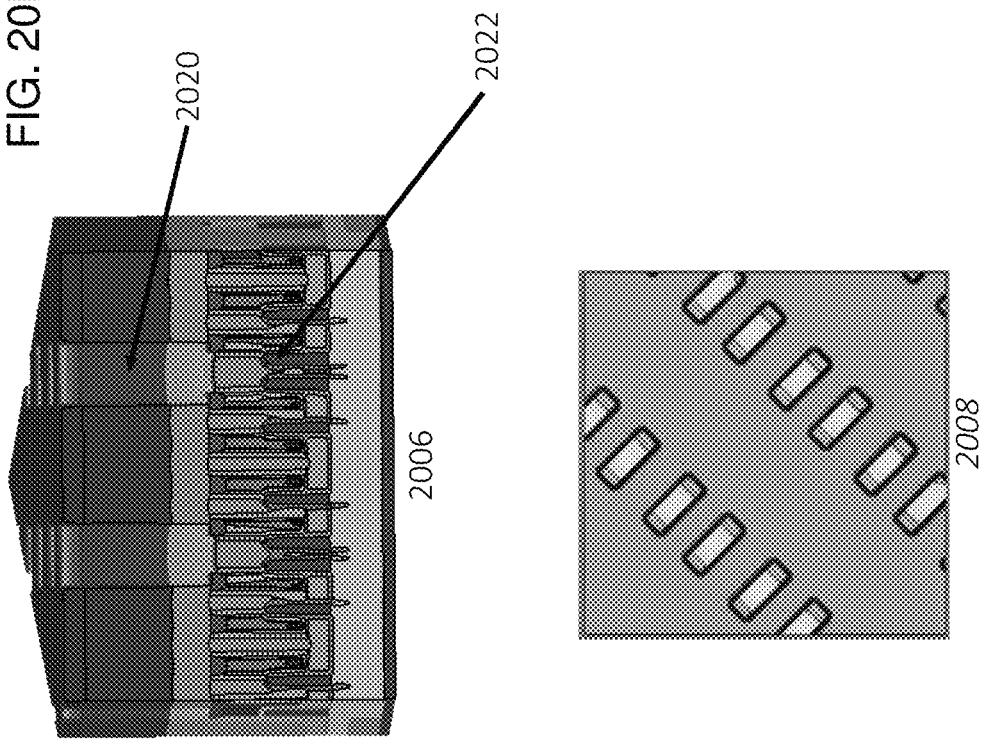
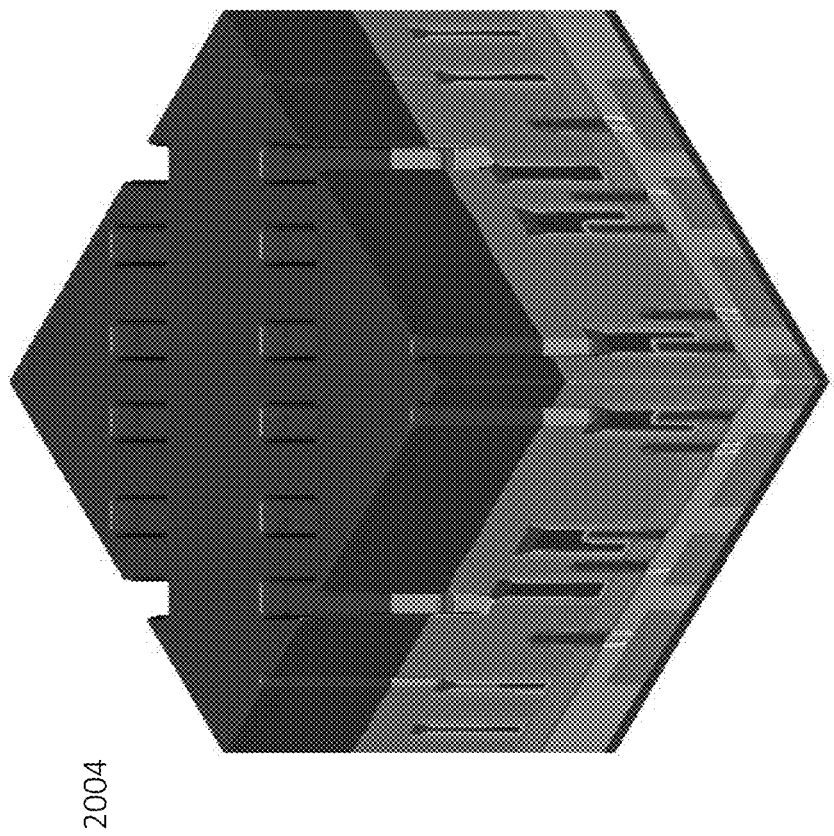
FIG. 20B

2102

FIG. 21B
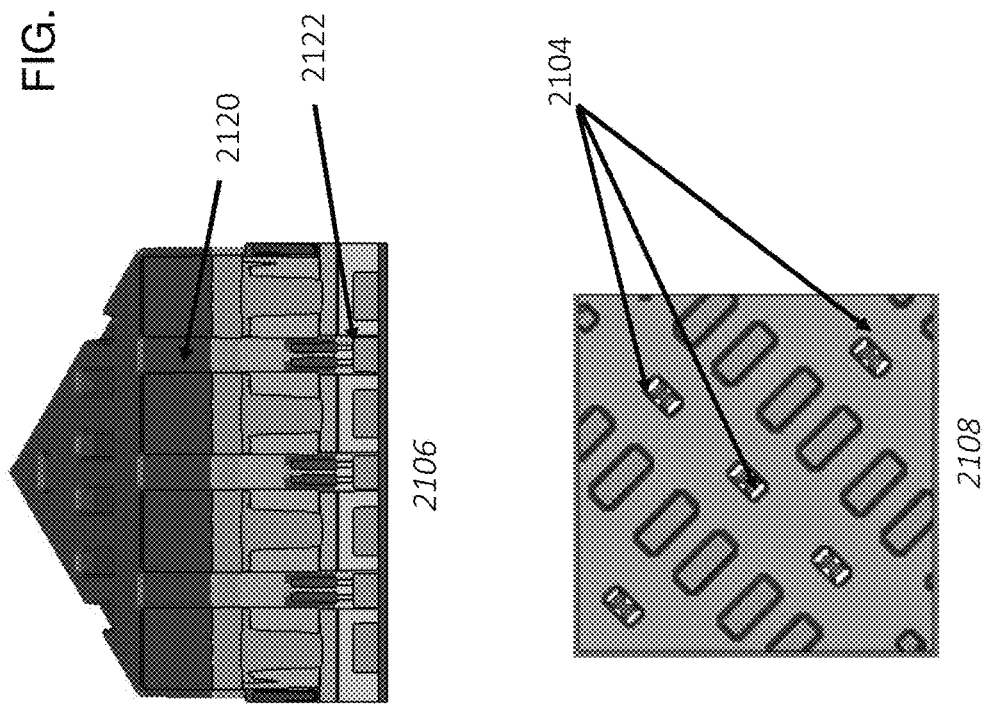
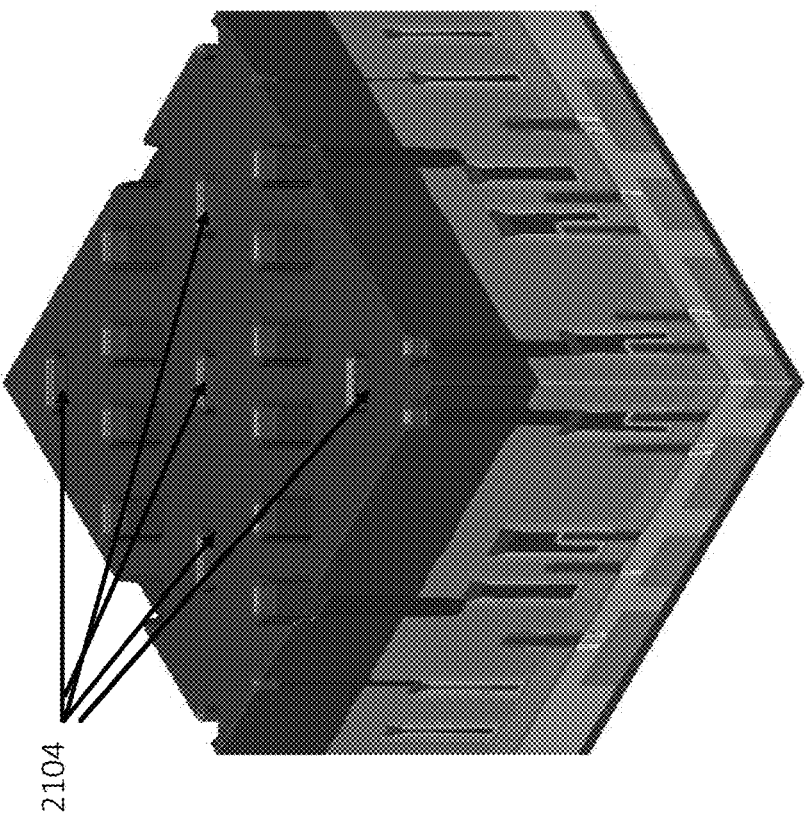

2202

2402
2404
2406

2502

FIG. 26
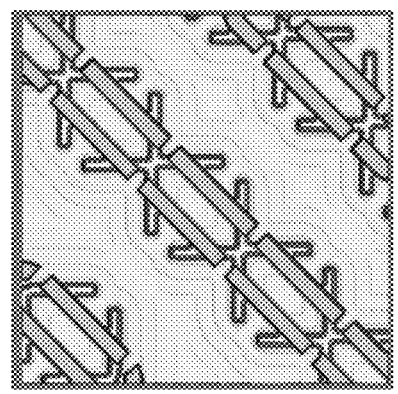
2604
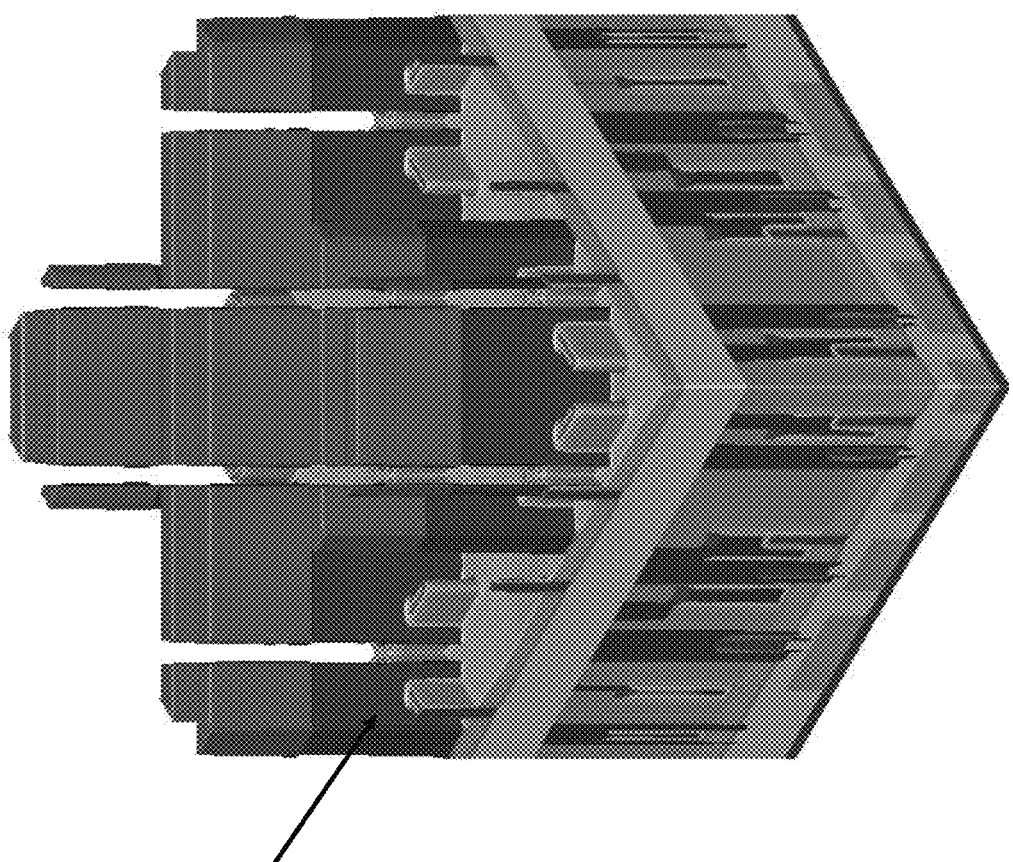
2602

2802

FIG. 28B
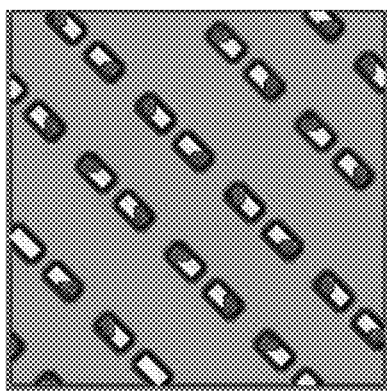
2830
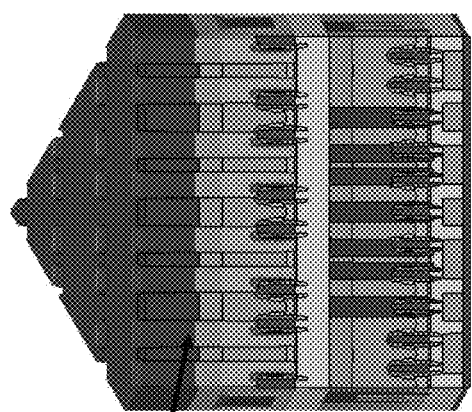
2820
2802
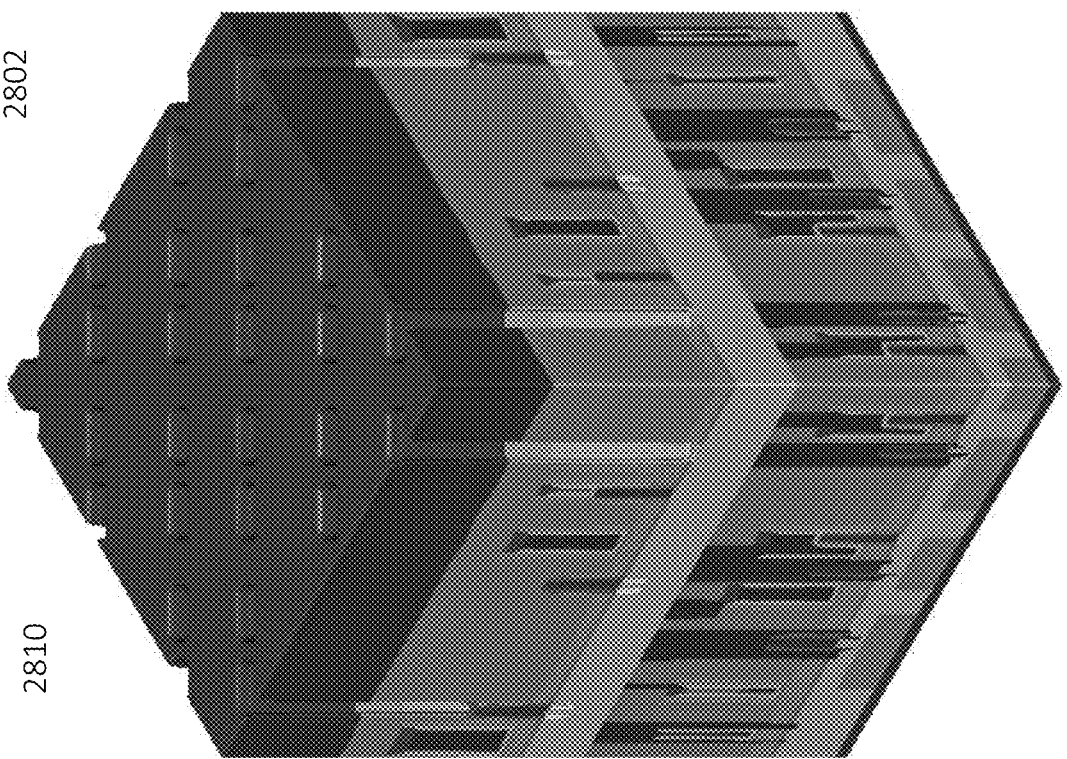
2810

2902

FIG. 29B
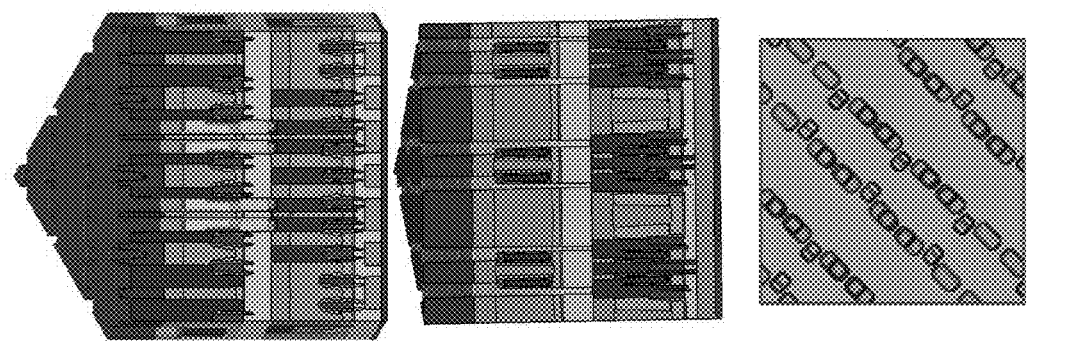
2906 2908 2910
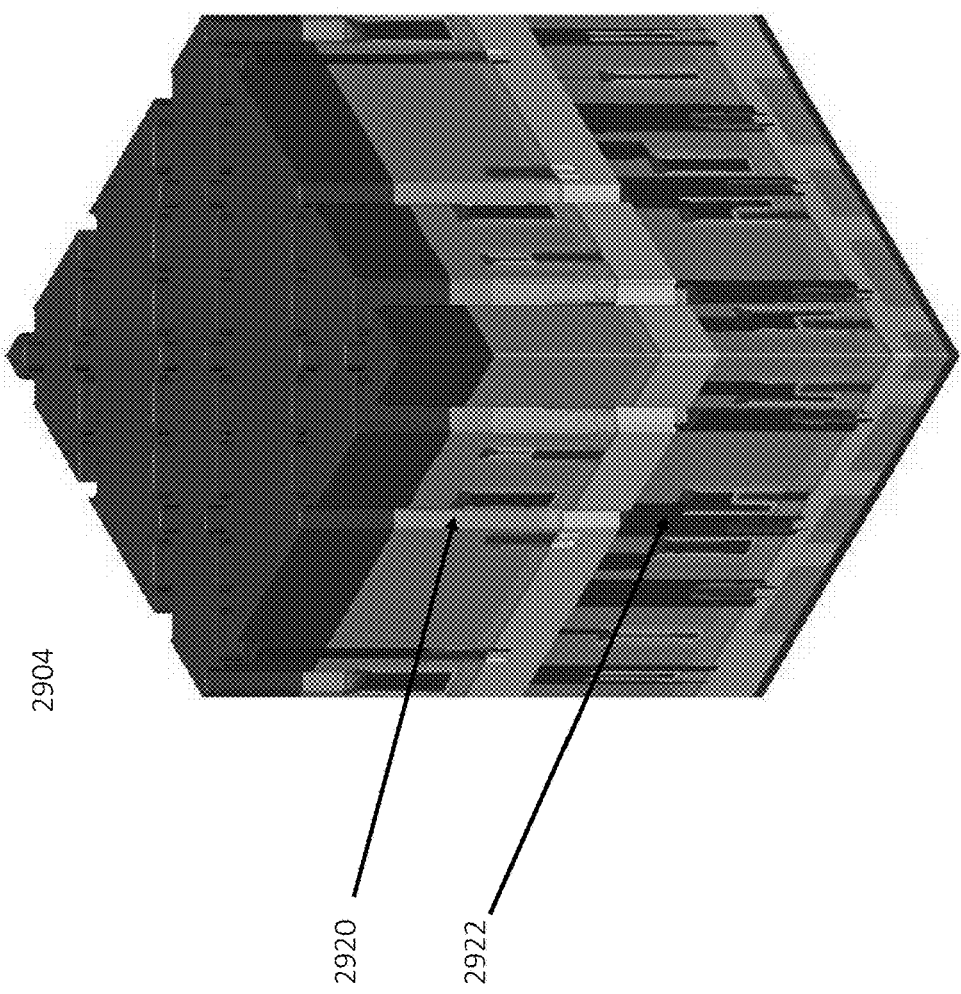
2904
2920
2922

3002

3102

FIG. 35
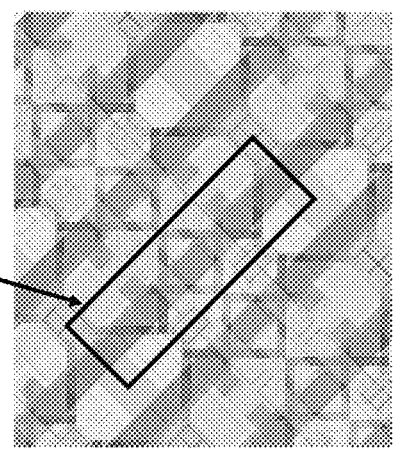
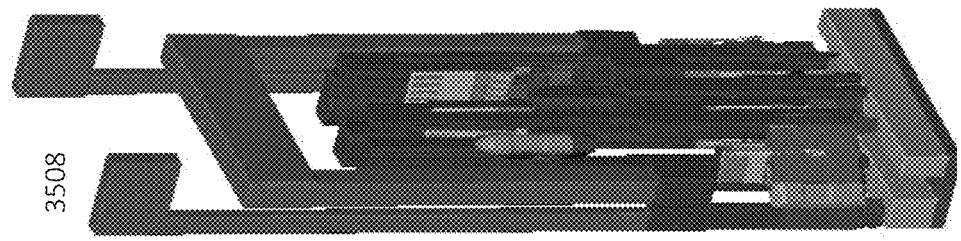
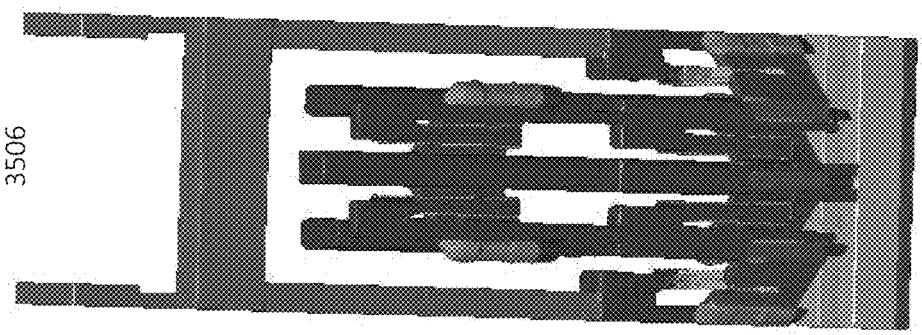
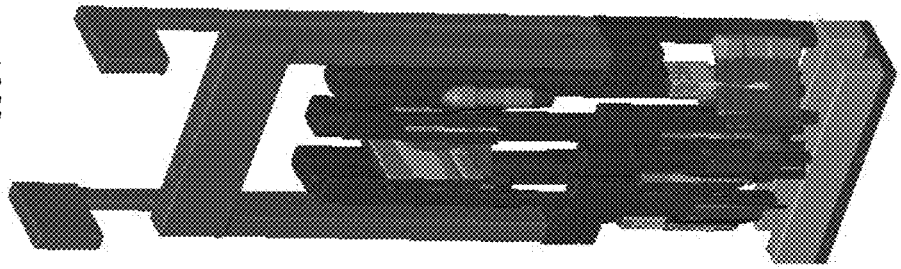
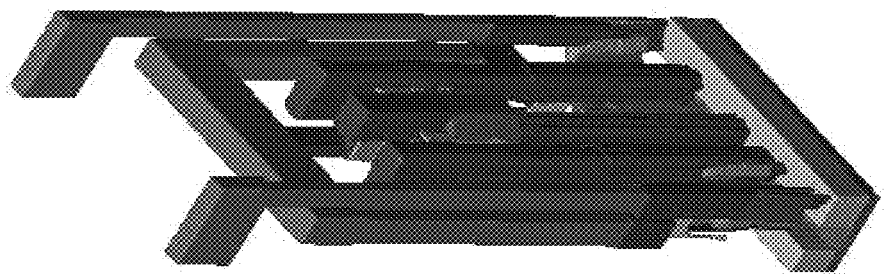

STATIC RANDOM-ACCESS MEMORY CELL DESIGN

RELATED APPLICATION

This application claims the benefit of, and priority to, U.S. Provisional Patent Application No. 62/896,754, filed Sep. 6, 2019, the contents of which are incorporated herein by reference in their entirety.

BACKGROUND

Static random-access memory (also referred to as static RAM or SRAM) is a type of semiconductor memory that uses bistable latching circuitry (flip-flop) to store each bit. SRAM is volatile in that data is eventually lost when the memory cell is not powered but unlike dynamic RAM (DRAM) does not need to be periodically refreshed via a refresh circuit.

A typical SRAM cell is made up of six metal-oxide-semiconductor field-effect transistors (MOSFETs) although SRAM cells may likewise include 4, 8, 10, or other numbers of transistors per bit to store and provide access to logic information. In a six-transistor SRAM design, each bit is formed by four transistors that form two cross-coupled inverters. Two additional access transistors serve to control the access to a memory cell during read and write operations. This storage cell has two stable states which are used to denote 0 and 1.

FIG. 1A (prior art) depicts a schematic of a conventional 6 transistor CMOS SRAM cell. CMOS is a type of MOSFET employing complementary and symmetrical pairs of p-type and n-type MOSFETs for performing logic functions. Each bit is stored on the 4 storage transistors (ST1, ST2, ST3 and ST4) and read and write operations are controlled via the access transistors (A5, A6). The two access transistors and two of the storage transistors are the same type (n-type in FIG. 1A) while the other two storage transistors are a different type (p-type in FIG. 1A). The two inverters (each composed of a p-type and n-type transistor) with drains and gate connected are designed back to back. The word line (WL) controls access to the memory cell by enabling the two access transistors. The access transistors control whether the cell is connected to the bit lines (BL) used for transferring data in read and write operations. FIG. 1B depicts a stylized layout of the transistor positions in a conventional 6 transistor CMOS SRAM cell. In this conventional SRAM memory cell layout, the two access transistors are n-type and the first and second inverters are respectively composed of pairs of n-type and p-type transistors laid out with the same orientation in a side-by-side arrangement.

Recent work to SRAM memory cell design has suggested employing a three-dimensional Complementary-FET (CFET) architecture which arranges p-type transistors on top of n-type transistors (or n-type on top of p-type) instead of using a conventional of side-by-side arrangement with all of the transistors on the same level of the memory cell. FIG. 2A (prior art) depicts the proposed layout of an inverter in a Complementary Field Effect Transistor (CFET) design for a memory cell. The inverter 200 includes a transistor 250 on a first layer 201 of the SRAM memory cell and a second transistor 252 of a different type on a second layer 202 of the SRAM memory cell. Each transistor includes a source (S), gate (G) and drain (D). In a FET, charge carriers (electrons or electron holes) flow from the source to the drain and the current is controlled by the application of voltage to the gate to alter an electric field and therefore the conductivity between source and drain. Conducting paths electrically connect the transistors 250, 252 to the power, ground, bit lines, and/or word lines used to set or read binary values in the invertor 200. In this example, a drain of the first transistor 250 and a drain of the second transistor 252 are electrically connected while a source of the first transistor 250 and a source of the second transistor 252 have separate connections. Of note, the second transistor 252 in the conventional CFET architecture is arranged above the first transistor 250 with the same orientation/direction as the transistor below.

BRIEF DESCRIPTION OF THE DRAWINGS

The accompanying drawings, which are incorporated in and constitute a part of this specification, illustrate one or more embodiments of the invention and, together with the description, help to explain the invention. In the drawings:

FIG. 2B depicts a layout of an inverter in a Complementary Field Effect Transistor (CFET) design for a memory cell and highlights a problem area in a proposed CFET SRAM memory cell design;

FIG. 3 is a diagram of the layout of a 6T Criss-Cross SRAM memory cell in an exemplary embodiment;

FIG. 20B depicts a result following an etch patterning step for contacting sources and drains to gates performed following the photolithography patterning step of FIG. 20A in a fabrication sequence in an exemplary embodiment;

FIG. 21B depicts a result following an etch patterning step for contacting vias to GND lines performed following the photolithography step of FIG. 21A in a fabrication sequence in an exemplary embodiment;

FIG. 26 depicts a result of a gate formation step performed in a fabrication sequence in an exemplary embodiment;

FIG. 28B depicts three views of an etch patterning for Metal 0 line formation step performed in a fabrication sequence in an exemplary embodiment;

FIG. 29B depicts an etch patterning step for gate to gate contact, source to source contact and drain to drain contact performed following the photolithography step of FIG. 29A in a fabrication sequence in an exemplary embodiment;

FIG. 35 depicts additional views of a unit cell of a 6-T Criss-Cross SRAM memory cell in an exemplary embodiment.

DETAILED DESCRIPTION

Figure 1A:
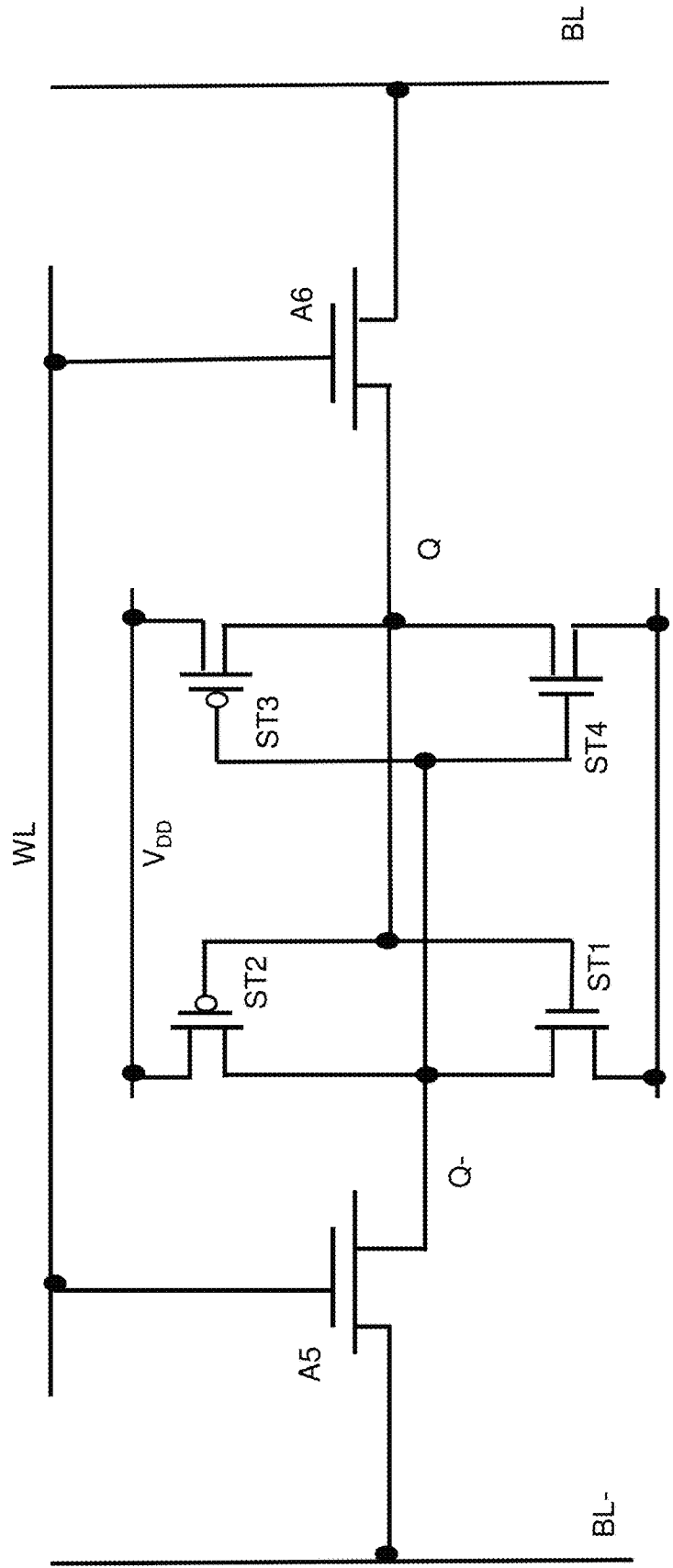
FIG. 1A (prior art) depicts a schematic of a conventional 6 transistor CMOS SRAM cell.
Figure 1B:
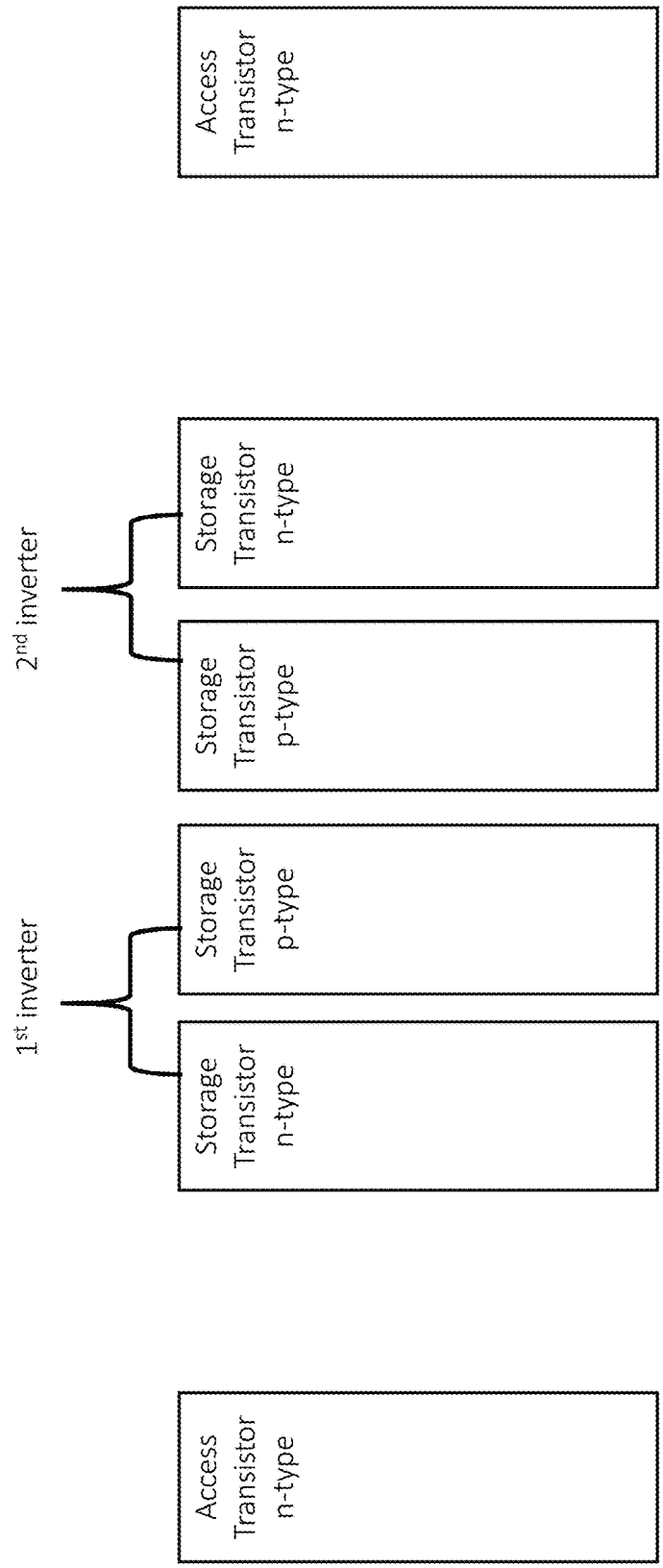
FIG. 1B (prior art) depicts a stylized layout of the transistors in a conventional 6 transistor CMOS SRAM cell.

In conventional memory cell layouts, the six transistors of a 6T-SRAM are traditionally laid-out side-by-side in a single layer of the memory cell (see for example the stylized representation in FIG. 1B above). However, the drive to reduce component size that underlies Moore's law applies to reductions in cell size of SRAM memory cells at each new technology node and so new memory cell layouts have been proposed that utilize a three-dimensional architecture in order to save space. One proposal for a three-dimensional layout for a 6T-SRAM cell is a CFET architecture. As discussed above in reference to FIG. 2A, in this proposed CFET layout, a first layer of the memory cell includes four transistors of the same type (i.e. four n-type or 4 p-type transistors) arranged as two access transistors and two storage transistors. Each of the two storage transistors belongs to a different cross-coupled inverter. A second layer includes two additional storage transistors that are the same type as each other but are different than the types of transistors on the first layer. In other words, if the first layer has four n-type transistors then the second layer has two p-type transistors (or vice versa). The two storage transistors in the second layer each form half of the cross-coupled inverter with a differently typed storage transistor on the first layer. Of note, in this proposed design, the transistors in the second layers of the inverters are aligned above the other transistor of the inverter in the lower first layer and are oriented in the same direction. As a result of this layout the sources and drains of the transistors in the upper layer are positioned directly over and oriented in the same direction of the respective sources and drains of the transistors in the lower layer. Such a design has a number of shortcomings.

The proposed conventional CFET design uses a mirroring type layout where the upper layer storage registers of the inverters effectively mimic the layout/orientation of the corresponding storage register in the lower layer. As a result, the routing of the connections between components can be quite complicated and in particular presents challenges for metal routing. Like most semiconductor devices, SRAM memory cells are fabricated in layers during an intricate fabrication process. During this fabrication process, the memory cell design should ideally provide connections that are kept as simple as possible and, between layers, as vertical as possible, to improve memory cell performance since long conductive paths result in parasitic resistive and capacitive losses that affect performance.

Figure 2A:
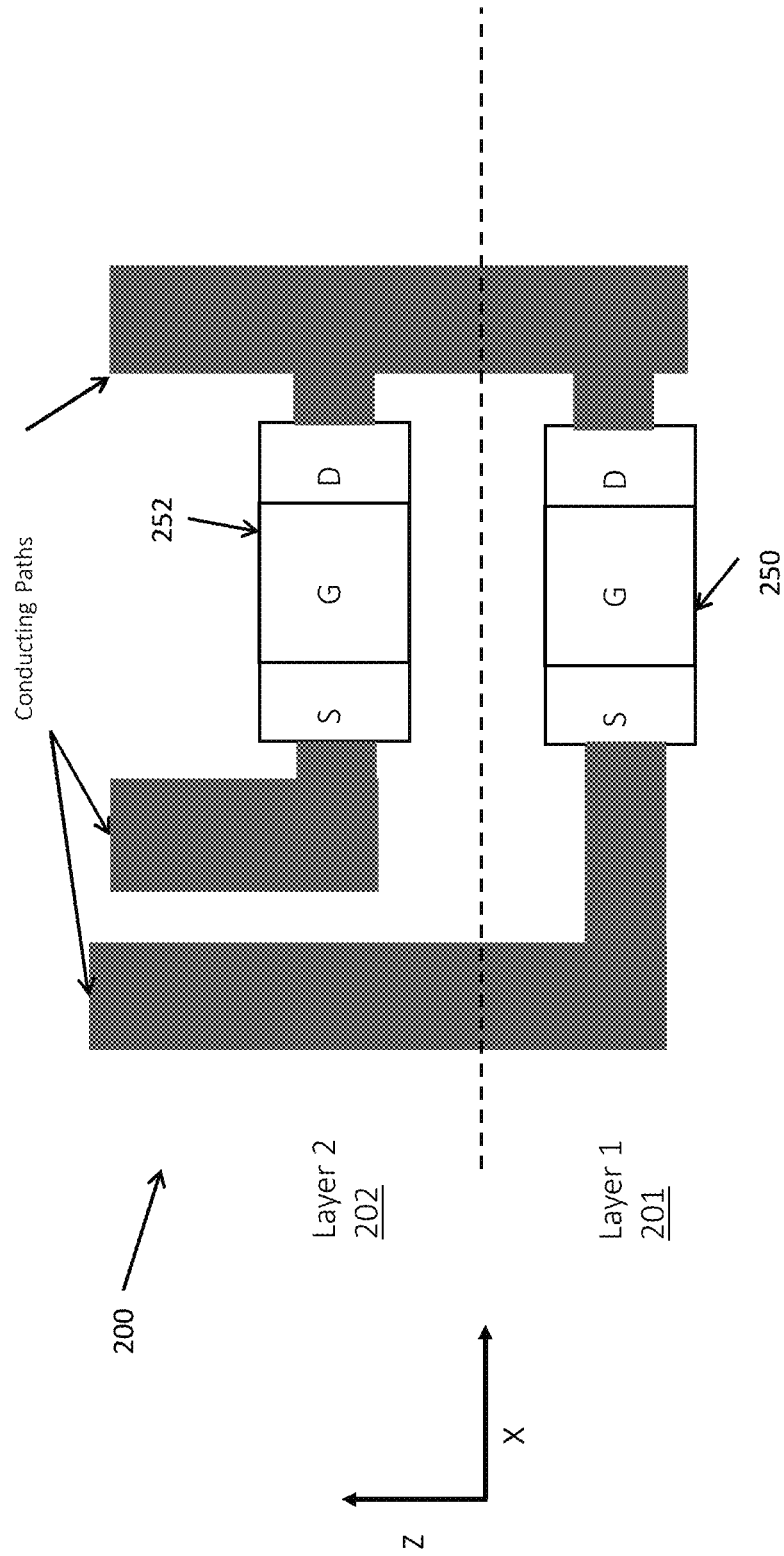
FIG. 2A (prior art) depicts a layout of an inverter in a Complementary Field Effect Transistor (CFET) design for a memory cell.

Unfortunately, the proposed conventional CFET design depicted above in FIG. 2A falls short of these goals for optimal memory cell design. For example, this type of CFET design presents challenges when routing connections between transistors, e.g., the upper drain to the lower source, while keeping the sources (and drains) isolated from one another. As depicted in FIG. 2B, the proposed conventional CFET design presents a high risk of electrical shorts because connection of conducting paths to components of the second transistor 252 from below the second layer 202 will require the conducting path to also pass near the first transistor 250. For example, it is difficult with such a design to connect the upper transistors to the buried VDD line or ground line as the lower transistor blocks the most direct path. Similarly, connection of conducting paths to components of the first transistor 250 from above the first layer 201 requires that the conducting path pass near the second transistor 252. As illustrated, this close approach of conducting paths creates small gaps between paths and, therefore, a high risk of short circuiting between paths or between path and transistor. For example, the connections to the sources in the depicted inverter are too close to each other and present a high risk of a short in the highlighted area 260. Further, it is difficult to connect bit lines from the highest layers of the memory cell to the lower transistor due to the upper transistor blocking the most direct path. Conventional solutions to this problem raise other undesirable issues. For example, the conducting paths can be made convoluted (e.g., with multiple jogs between vertical and horizontal sections or placement at angles), but such a modification adds additional complex steps to the fabrication. The conducting paths can also be extended further away from the transistors and each other, but this increases the overall footprint of the inverter 200 and prevents tight packaging of many inverters into a small space. As such, the resulting cell may not be suitable for future technology nodes that demand smaller and smaller feature sizes.

To address these shortcomings in three-dimensional 6T-SRAM design, embodiments of the present invention utilize a criss-cross design of the cross-coupled inverters in the memory cell to simplify connections and improve fabrication and performance. Embodiments provide an SRAM memory cell design in which a storage transistor of a cross-coupled inverter is provided on a second layer located above and o the other storage transistor of the cross-coupled inverter on the first layer below. The storage transistor on the second layer is rotated in orientation by approximately 90° (from the conventional CFET design previously discussed) so as to be substantially perpendicular in orientation when viewed from above to the other transistor of the cross-coupled inverter that is located on the first layer. Thanks to this re-alignment of the top transistor, the source and drain of the top transistor are not on top of the source and drain of the bottom transistor. By "criss-crossing" transistors on different layers (when viewed from above), electrical connections between a transistor on the upper layer and source (VDD) or ground lines in the substrate (e.g.: drain to drain, source to GND/VDD or SRAM to SRAM) may be realized by nearly vertical contacts and can be reduced in overall length resulting in a simpler fabrication process. Moreover, the sources and drains of transistors in the different layers are spatially well isolated with this improved design resulting in less risk of an electrical short between connections. Further, by rotating the orientation of transistors in different layers, the overall area of the memory cell on a substrate can be reduced by up to 50% as compared to conventional memory cell designs resulting a much denser design.

FIG. 3 is a diagram of the layout of a 6T Criss-Cross SRAM memory cell 300 in an exemplary embodiment. The memory cell 300 includes a first storage transistor 310, a second storage transistor 312, a third storage transistor 314, a fourth storage transistor 316, a first access transistor 320, and a second access transistor 322. The memory cell 300 also includes a first bit line (BL) 336, a second bit line (BL-) 338, a word line (WL) 334, a Voltage Drain Drain line (VDD) 332, and a ground line (GND) 330. The first and second access transistors 320, 322 and the first, second, third and fourth storage transistors 310, 312, 314, 316 each include a source located at a first end, a drain located at a second end, and a gate located at an approximate mid-point in the respective transistor. The first storage transistor 310, the third storage transistor 314, the first access transistor 320, and the second access transistor 322 are located on a first layer 301 while the second storage transistor 312 and the fourth storage transistor 316 are located on a separate second layer 302 above the first layer. The first and second storage transistors 310, 312 form a first cross-coupled inverter connected to the first access transistor 320 while the third and fourth storage transistors 314, 316 form a second cross-coupled inverter connected to the first cross-coupled inverter and the second access transistor 322. The first storage transistor 310 is oriented in a same direction as the first access transistor 320 and is oriented in a direction substantially perpendicular to a direction of the third storage transistor 314 and the second access transistor 322. The third storage transistor 314 is oriented in a same direction as the second access transistor 322. The second storage transistor 312 is oriented in a direction substantially perpendicular to the direction in which the first storage transistors 310 is oriented when viewed from above. The fourth storage transistor 316 is oriented in a direction substantially perpendicular to the direction in which the third storage transistor 314 is oriented when viewed from above. A midpoint of the second storage transistor 312 is located substantially over a midpoint of the first storage transistor 310 while a midpoint of the fourth storage transistor 316 is located substantially over a midpoint of the third storage transistor 314. By orienting the storage transistors on the second layer in a perpendicular direction (when viewed from above) to the directions of their respective storage transistors on the first layer which they form a cross-coupled inverter, routing of electrical connections among components within the memory cell 300 (e.g., sources, drains, VDD line 332, GND line 330) and between adjacent memory cells can be realized using nearly vertical conducting paths that are significantly shorter than conducting paths in conventional designs. In addition, the memory cell 300 is highly compact with an overall size reduction of the memory cell 300 of about 50% over conventional designs that utilize six transistors on the same layer, which enables a higher areal density of memory cells 300 on the substrate. For example, an areal dimension of the memory cell 300 can be as small as 0.009 µm² in some embodiments.

The word line 334 is located at least partially on a third layer 303 and connects a gate 120g of the first access transistor 320 to a gate 322g of the second access transistor 322. A first bit line (BL) 336 is located at least partially on a fourth layer 304 and is connected to a drain 320d of the first access transistor 320, and the second bit line (BL-) 338 is located at least partially on the fourth layer 304 and is connected to a source 322s of the second access transistor 322. The VDD line 332 and the GND line 330 are at least partially submerged in a substrate/layer 0 99 beneath the first layer 301. The VDD line 332 connects to at least one of a source 316s of the fourth storage transistor 316 or a drain 312d of the second storage transistor 312 on the second layer 302. The GND line 334 connects to at least one of a source 314s of the third storage transistor 314 or a drain 310d of the first storage transistor 310 on the first layer 301.

In exemplary embodiments, transistors located on a same layer are of the same type but differ from the type of transistors on a different layer. For example, in some embodiments, the first and second access transistors 320, 322 and the first and third storage transistors 310, 314 on the layer 1 (301) can be, but are not limited to, n-type field-effect transistors (nFETs), such as n-channel MOSFETs. In such an embodiment, the second and fourth storage transistors 312, 316 can then be p-type FETs (pFETs) such as p-channel MOSFETs. Alternatively, in other embodiments, the transistors located on the first layer can be p-type transistors while the transistors located on the second layer can be n-type transistors.

In accordance with various embodiments, the drain 312d of the second storage transistor 312 and the source 316s of the fourth storage transistor 316 can be merged to form a single merged source and drain on the second layer. By merging the drain 312d and the source 316s, the conductive path that would typically be present to connect the two is removed entirely thus reducing losses associated with the conductive path. Similarly, the drain 310d of the first storage transistor 310 and the source 314s of the third storage transistor 314 can be merged to form a single merged source and drain on the first layer. In another embodiment, the drain 312d of the second storage transistor 312 and the source 316s of the fourth storage transistor 316 on the second layer and drain 310d of the first storage transistor 310 and the source 314s of the third storage transistor 314 on the first layer are each merged to form merged sources and drains on both the first layer 301 and the second layer 302.

As shown in FIG. 3, components of the memory cell 300 occupy five separate layers 99, 301, 302, 303, 304. However, embodiments of the present invention are not limited to utilizing only five layers and more or less layers could be used according to application-specific needs. For example, as a non-limiting example of alternatives, the word line 303 and bit lines 336, 338 are depicted in FIG. 3 as being in the third layer 303 and fourth layer 304, respectively. However, some embodiments may place the word line 303, first bit line 336, and second bit line 338 in a same layer or may place the first bit line 336 and second bit line 338 in different layers. It should be appreciated that other configurations different from those specifically illustrated in FIG. 3 but providing similar functionality should also be considered to be within the scope of the present invention.

Figure 4:
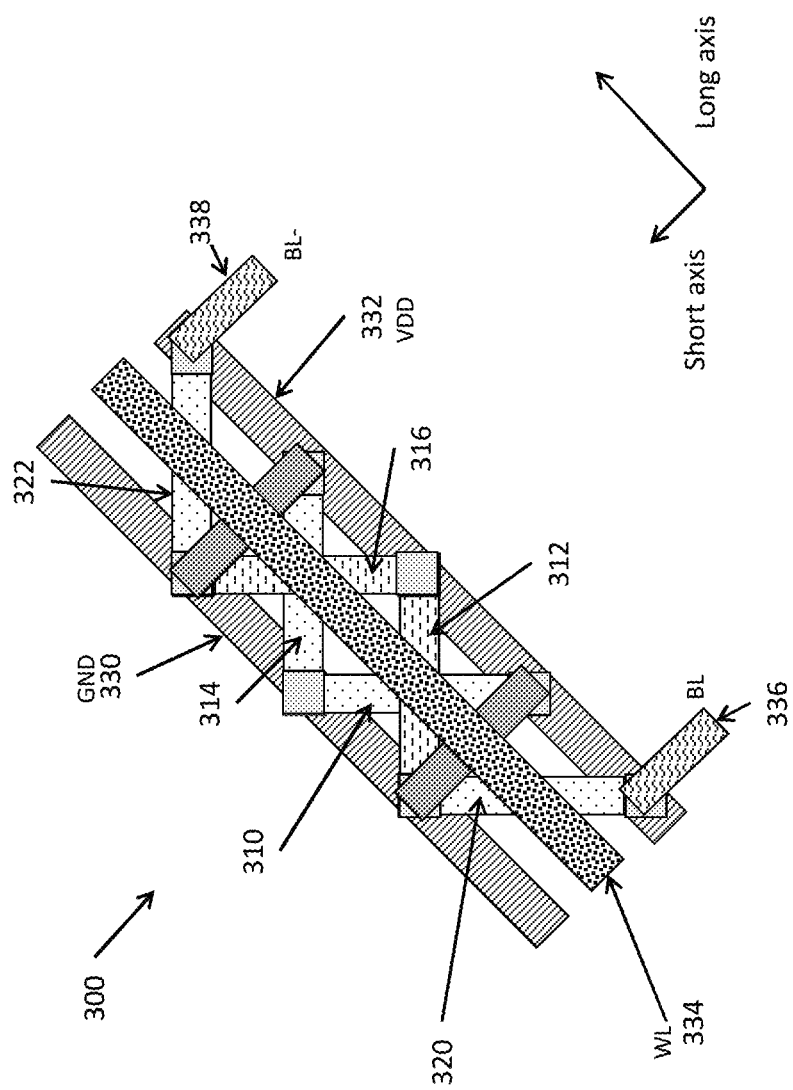
FIG. 4 is a top view of the layout of a 6T Criss-Cross SRAM memory cell in an exemplary embodiment.

FIG. 4 illustrates a top view of the memory cell 300 of FIG. 3. It should be noted that viewed from above transistor 312 on the second layer 302 forms a criss-cross shape with transistor 310 on the first layer 301 (i.e. the transistors appear as a + symbol from above) with the top transistor 312 oriented in a direction approximately 90 degrees offset from that of transistor 310 (i.e. in a substantially perpendicular orientation). Similarly, transistor 316 on the second layer 302 also forms a criss-cross shape with transistor 314 on the first layer 301.

Figure 5:
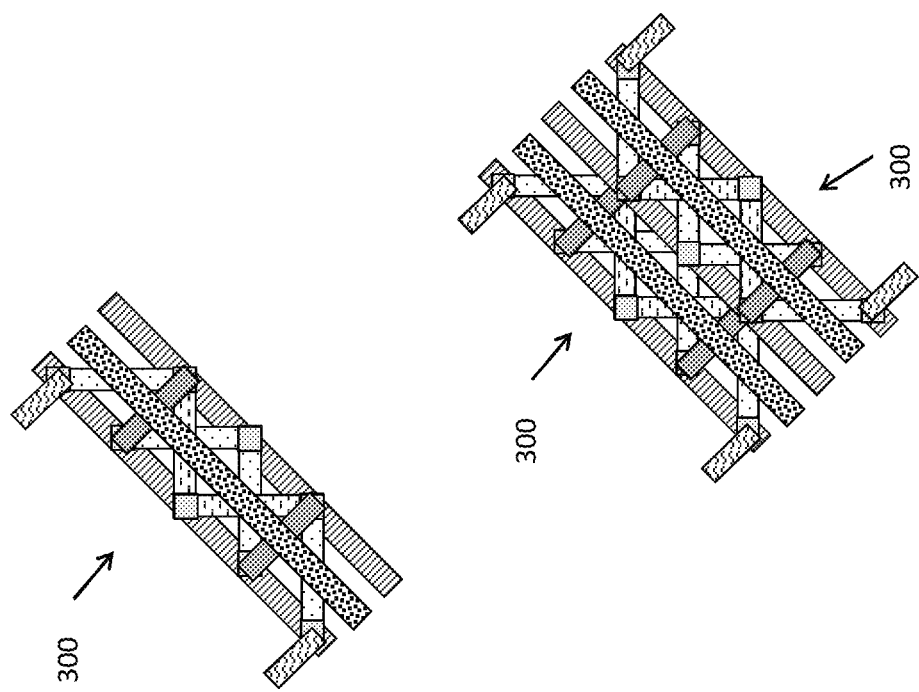
FIG. 5 is a diagram of two 6T Criss-Cross SRAM memory cells arranged back-to-back position in an exemplary embodiment.
Figure 6:
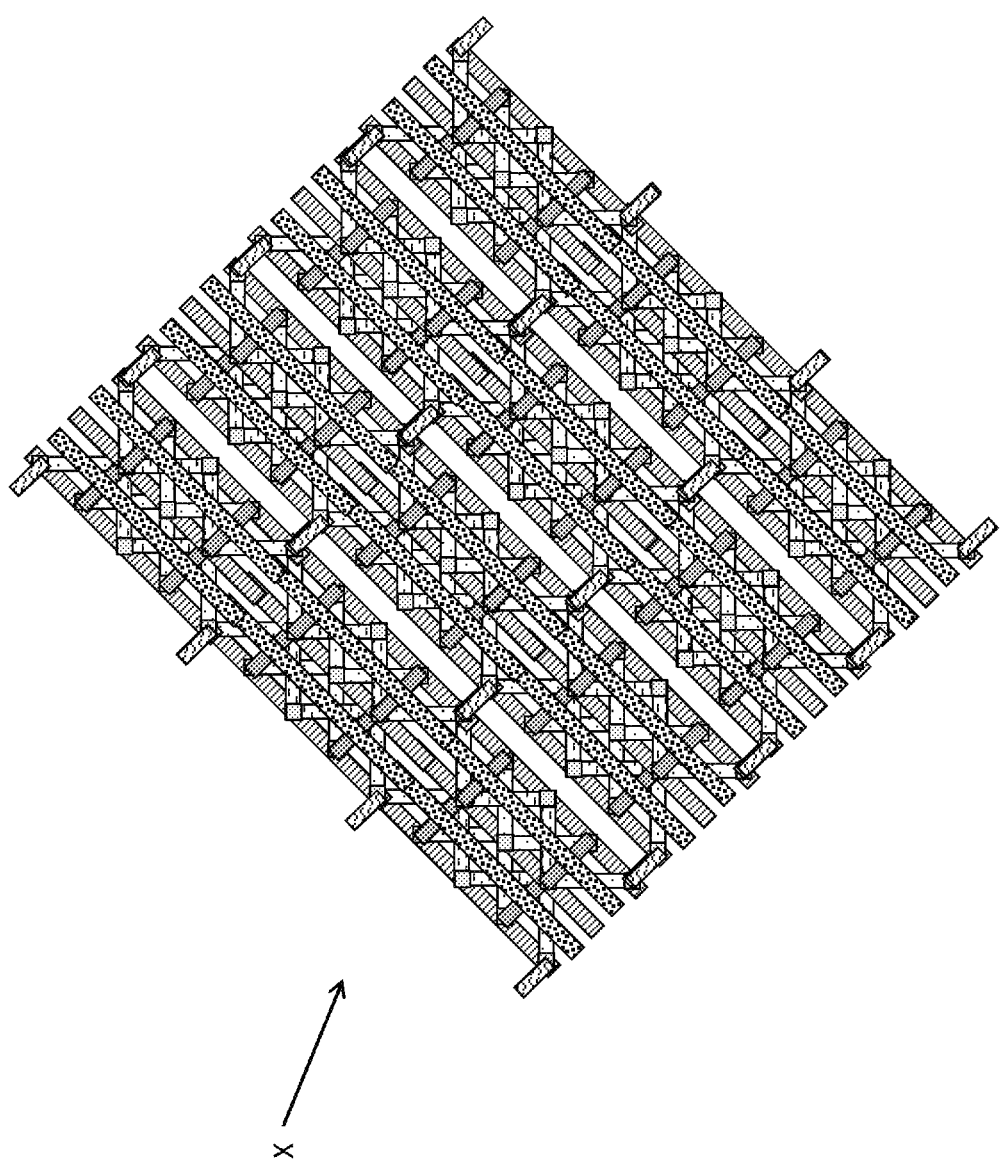
FIG. 6 is a diagram of twenty-four 6T Criss-Cross SRAM memory cells arranged back to back and side to side in an exemplary embodiment.

Because transistors within each memory cell 300 are crossed, symmetries are created that simplify placement and packing of multiple memory cells into a memory module unit. FIG. 5 depicts an exemplary layout of memory cells 300. The compact layout of each memory cell 300 means that tiling the memory cells 300 back-to-back and side-by-side on a substrate can be done with relative ease. For example, two memory cells 300 can be fabricated back-to-back by rotating one memory cell by 180° and having the two memory cells share a single GND line 330. The compact architecture of FIG. 5 may then be extended to include more memory cells. FIG. 6 is a diagram of twenty-four 6T Criss-Cross SRAM memory cells 300 arranged back to back and side to side in an exemplary embodiment. This enables neighboring pairs of cells to be placed adjacent to one another along the same GND 330 and VDD 332 lines. In some embodiments, neighboring pairs of cells can share positive and/or negative bit line contacts 336, 338. Moreover, neighboring lines of paired cells can be placed such that cells in one line share positive and/or negative bit line contacts 336, 338.

An exemplary fabrication sequence for producing the 6T Criss-Cross SRAM memory cell 300 of FIG. 3 is now discussed with the aid of FIGS. 7-33. It should be appreciated that the illustrative sequence is not exhaustive as an actual fabrication sequence for producing the 6T Criss-Cross SRAM memory cell 300 would include additional steps to those illustrated and discussed herein and that additional steps may be included or substituted for those illustrated.

Figure 7:
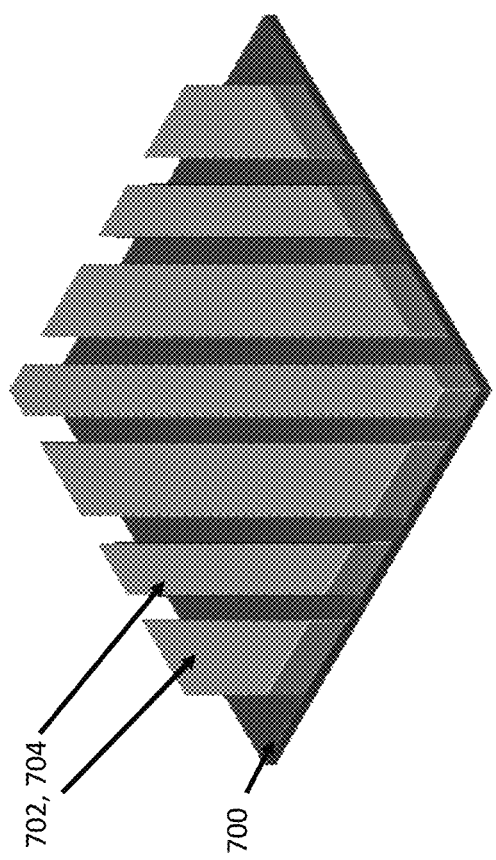
FIG. 7 depicts the patterning of the GND and VDD lines on the substrate during fabrication of a sub-layer in a fabrication sequence in an exemplary embodiment.

The illustrative fabrication sequence begins with fabrication of a buried power rail by patterning of the VDD lines 702 and GND lines 704 on the substrate 700 as depicted in FIG. 7.

Figure 8:
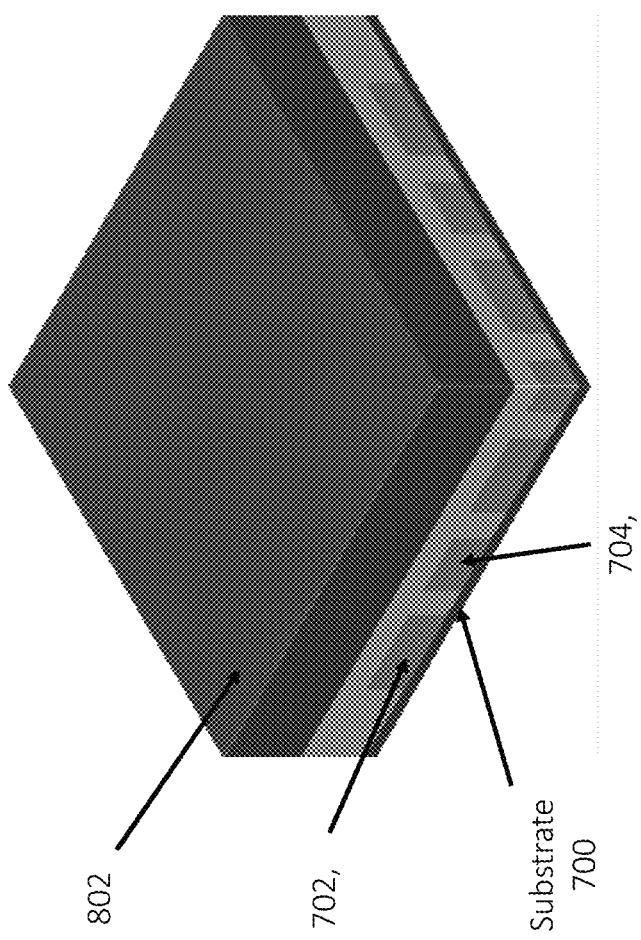
FIG. 8 depicts oxide cladding and Si layer bonding in a fabrication sequence in an exemplary embodiment.

FIG. 8 depicts an oxide cladding and Si layer bonding step in a fabrication sequence in an exemplary embodiment. More particularly, FIG. 8 depicts the beginning of the creation of nFETs on the first layer of the memory cell 300. An Si layer 802 is bonded on top of the first wafer after oxide cladding and etched back.

Figure 9:
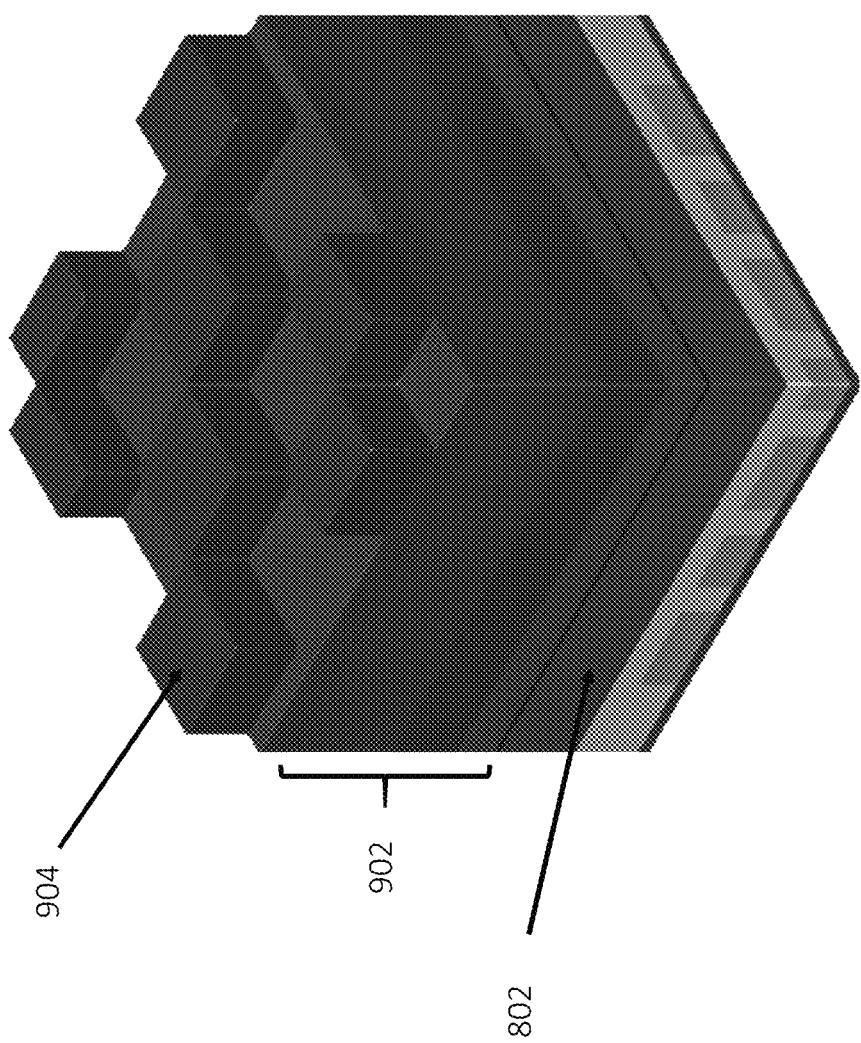
FIG. 9 depicts a fin mandrel patterning step in a fabrication sequence in an exemplary embodiment.

FIG. 9 depicts a fin mandrel by resist patterning step in a fabrication sequence in an exemplary embodiment. A fin patterning stack 902 is deposited atop the bonded Si layer 802. Resist patterning 904 is then performed. Of note, the patterning utilizes orthogonal/square patterns rather than more traditional line patterns which results in fins that are orthogonal to each other. Since performing the patterning with orthogonal/square patterns allows the fins to be patterned more quickly, their use provides a more efficient fabrication process.

Figure 10:
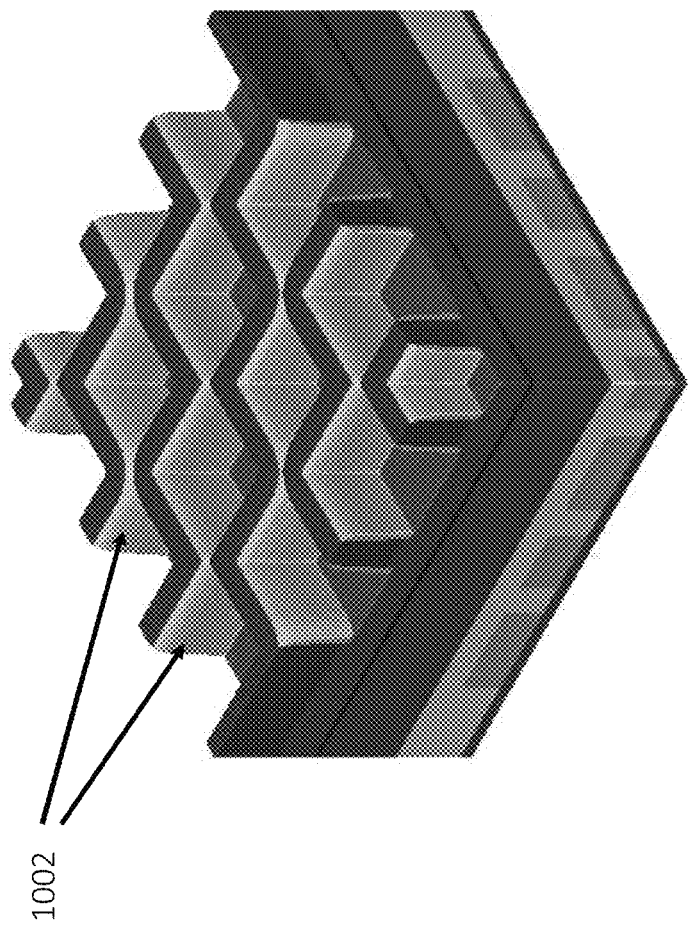
FIG. 10 depicts a Self-Aligned Quadruple Patterning (SAQP) step in a fabrication sequence in an exemplary embodiment.

FIG. 10 depicts a Self-Aligned Quadruple Patterning (SAQP) step in a fabrication sequence in an exemplary embodiment. SAQP spacers are used for a fin patterning hard mask. SAQP is performed by $1^{st}$ spacer deposition/spacer etch/resist removal, then $2^{nd}$ spacer deposition followed by $2^{nd}$ spacer etch.

Figure 11:
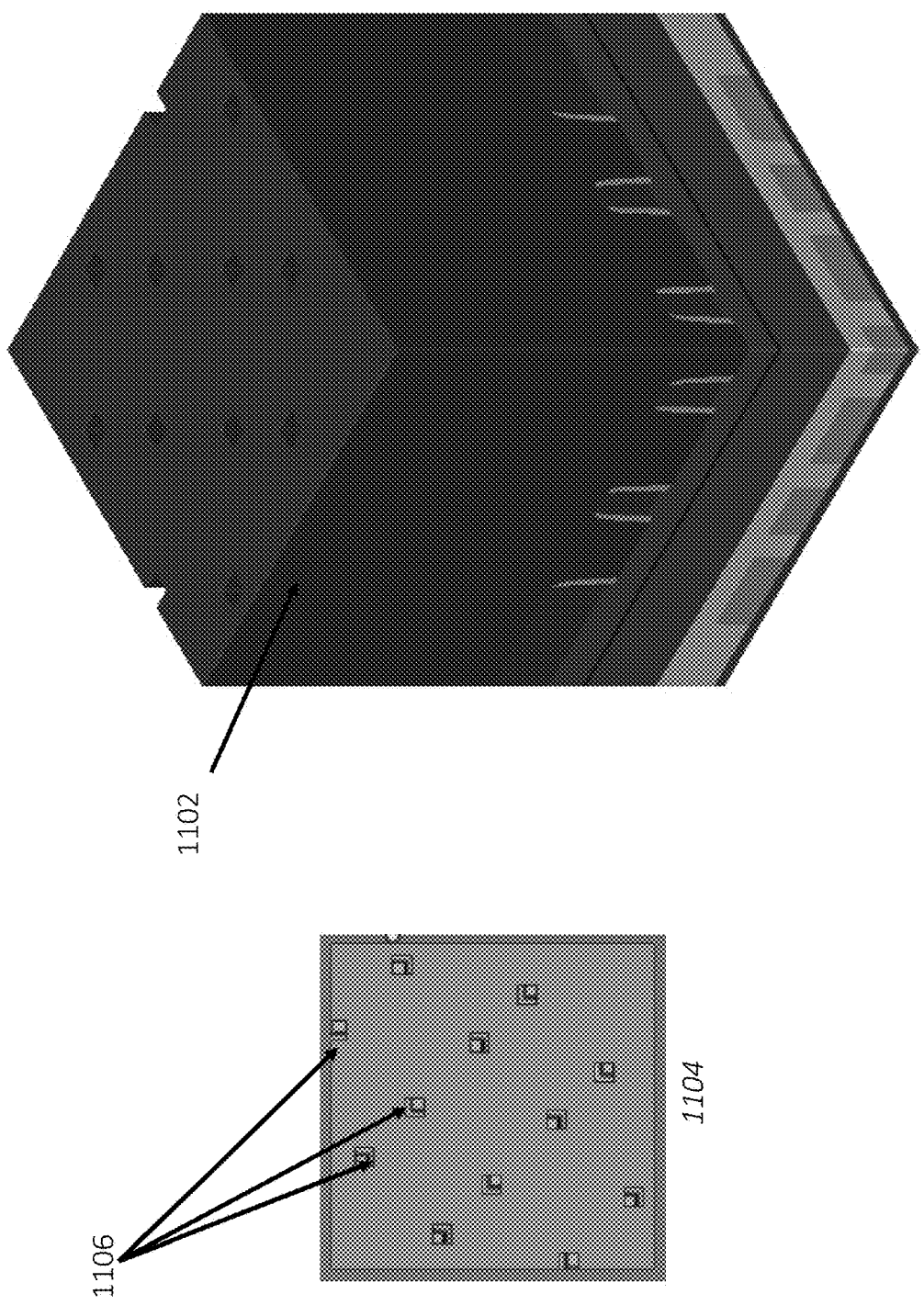
FIG. 11 depicts a fin cut lithography step in a fabrication sequence in an exemplary embodiment.

FIG. 11 depicts a fin cut lithography step in a fabrication sequence in an exemplary embodiment. More particularly, resist 1102 is deposited and patterned for cutting a second spacer on specified locations 1106 as seen in top view 1104.

Figure 12:
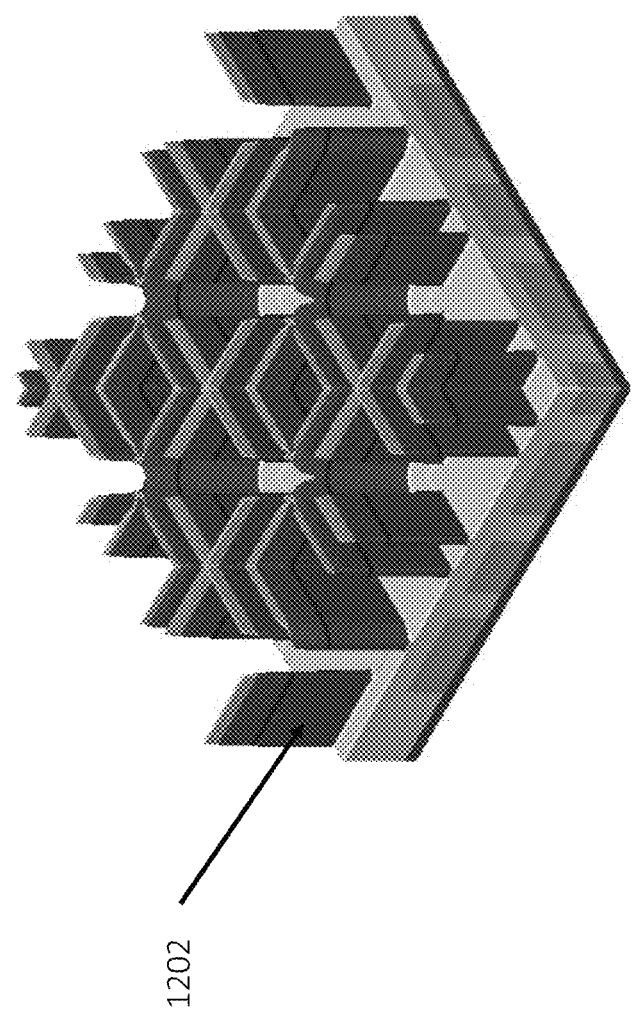
FIG. 12 depicts a fin cut etch step in a fabrication sequence in an exemplary embodiment.

FIG. 12 depicts a fin cut etch step in a fabrication sequence in an exemplary embodiment. After resist removal, $1^{st}$ spacer removal and etch transfer to Si for fin formation, a patterned fin array 1202 is produced.

Figure 13:
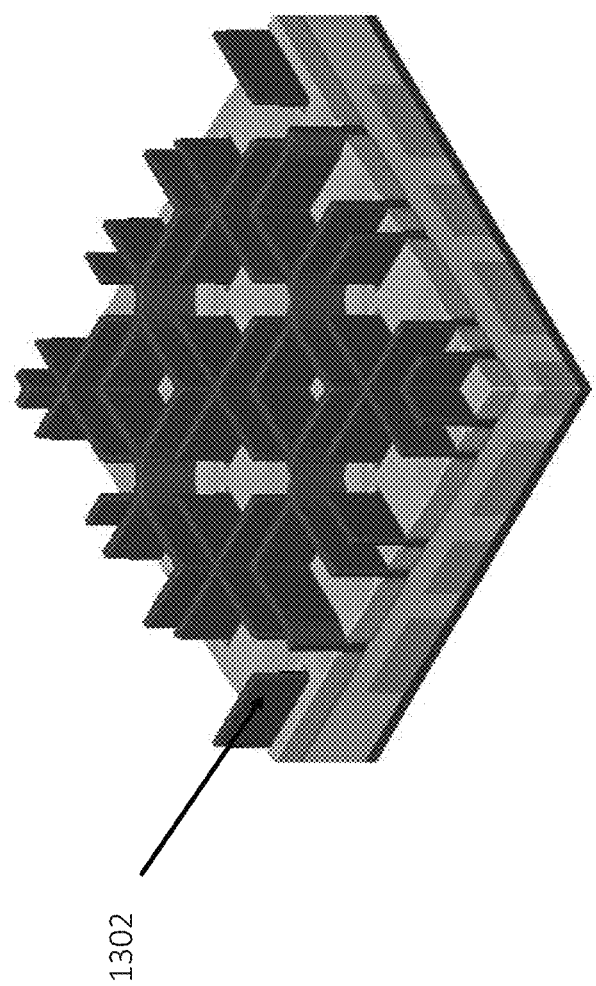
FIG. 13 depicts the results of a hard mask removal and well and Shallow Trench Isolation (STI) formation step in a fabrication sequence in an exemplary embodiment.

FIG. 13 depicts the patterned fin array 1302 after a hard mask removal and well and Shallow Trench Isolation (STI) formation step in a fabrication sequence in an exemplary embodiment.

Figure 14:
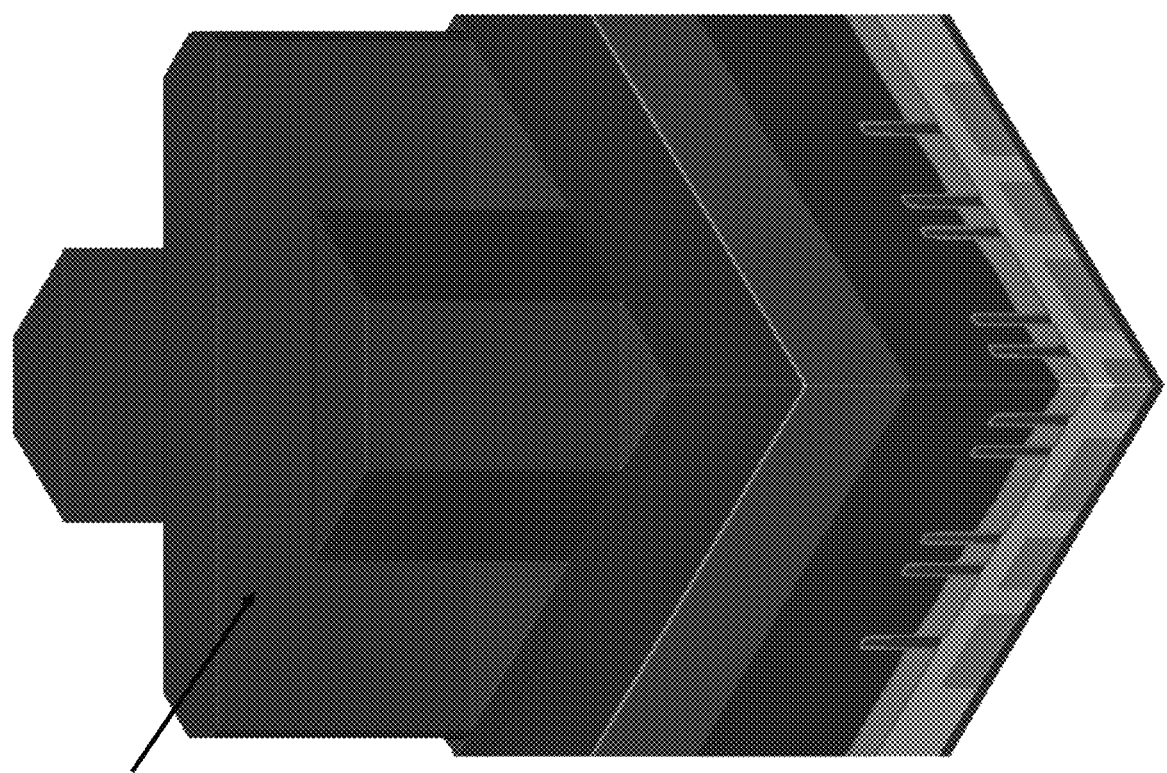
FIG. 14 depicts a gate lithography step in a fabrication sequence in an exemplary embodiment.

FIG. 14 depicts a gate lithography step in a fabrication sequence in an exemplary embodiment. The results 1402 of resist deposition and patterning for a gate are depicted.

Figure 15:
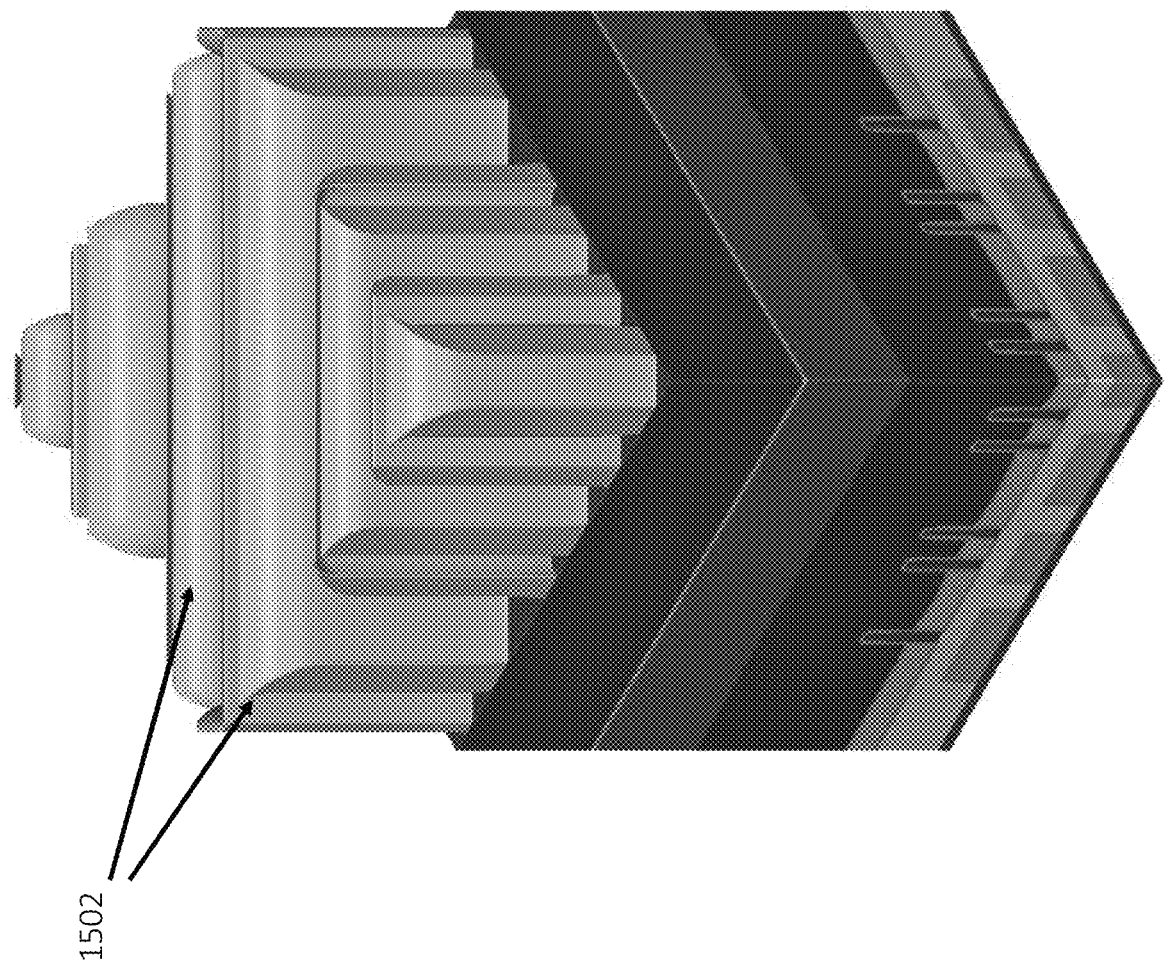
FIG. 15 depicts an SAQP gate patterning HM step in a fabrication sequence in an exemplary embodiment.

FIG. 15 depicts an SAQP gate patterning HM step in a fabrication sequence in an exemplary embodiment. The step uses SAQP spacers for gate line 1502 formation.

Figure 16:
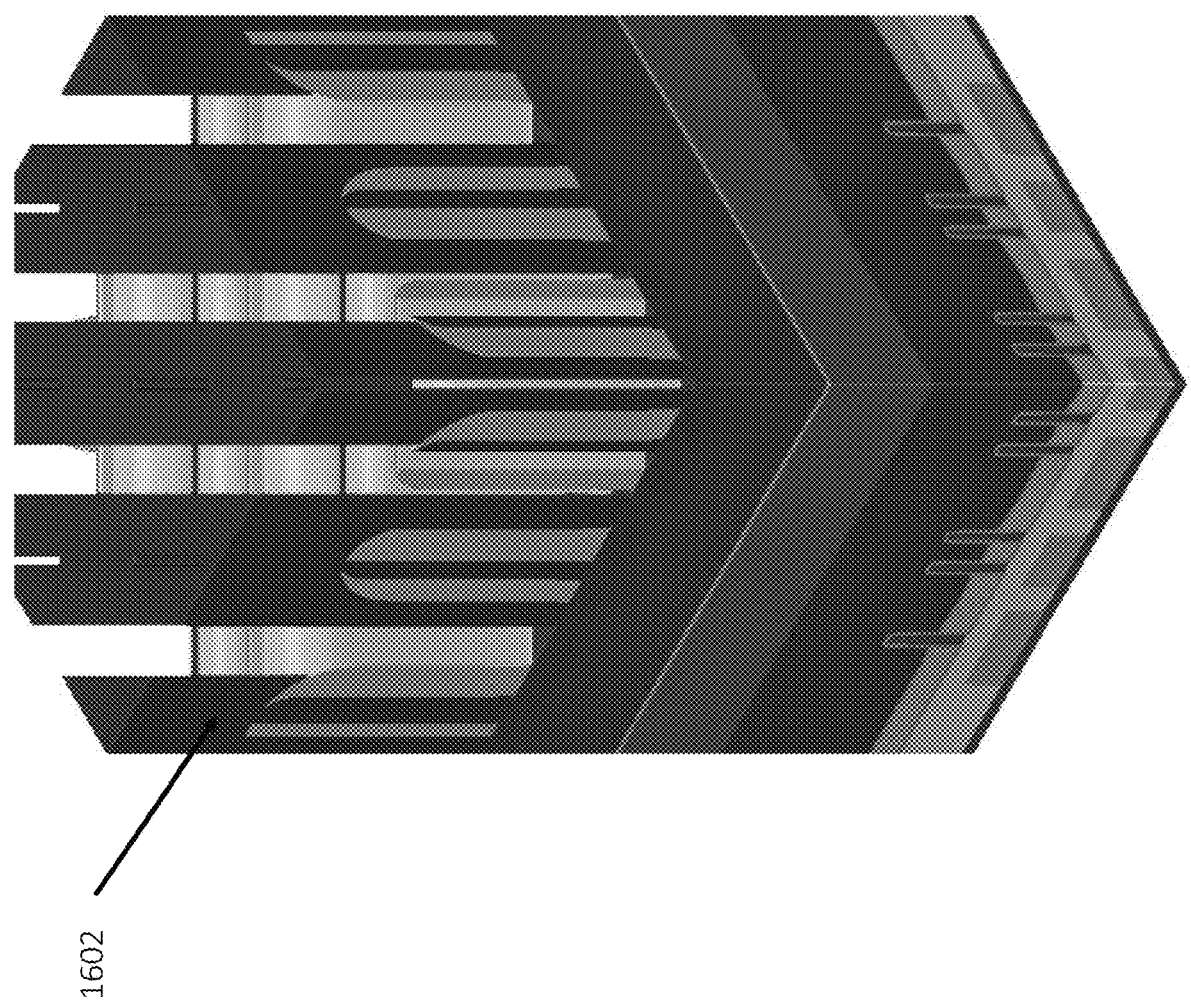
FIG. 16 depicts a gate cut lithography step in a fabrication sequence in an exemplary embodiment.

FIG. 16 depicts a gate cut lithography step in a fabrication sequence in an exemplary embodiment. Resist deposition 1602 is performed for cutting the $2^{nd}$ spacer from the gate SAQP on a specific location.

Figure 17:
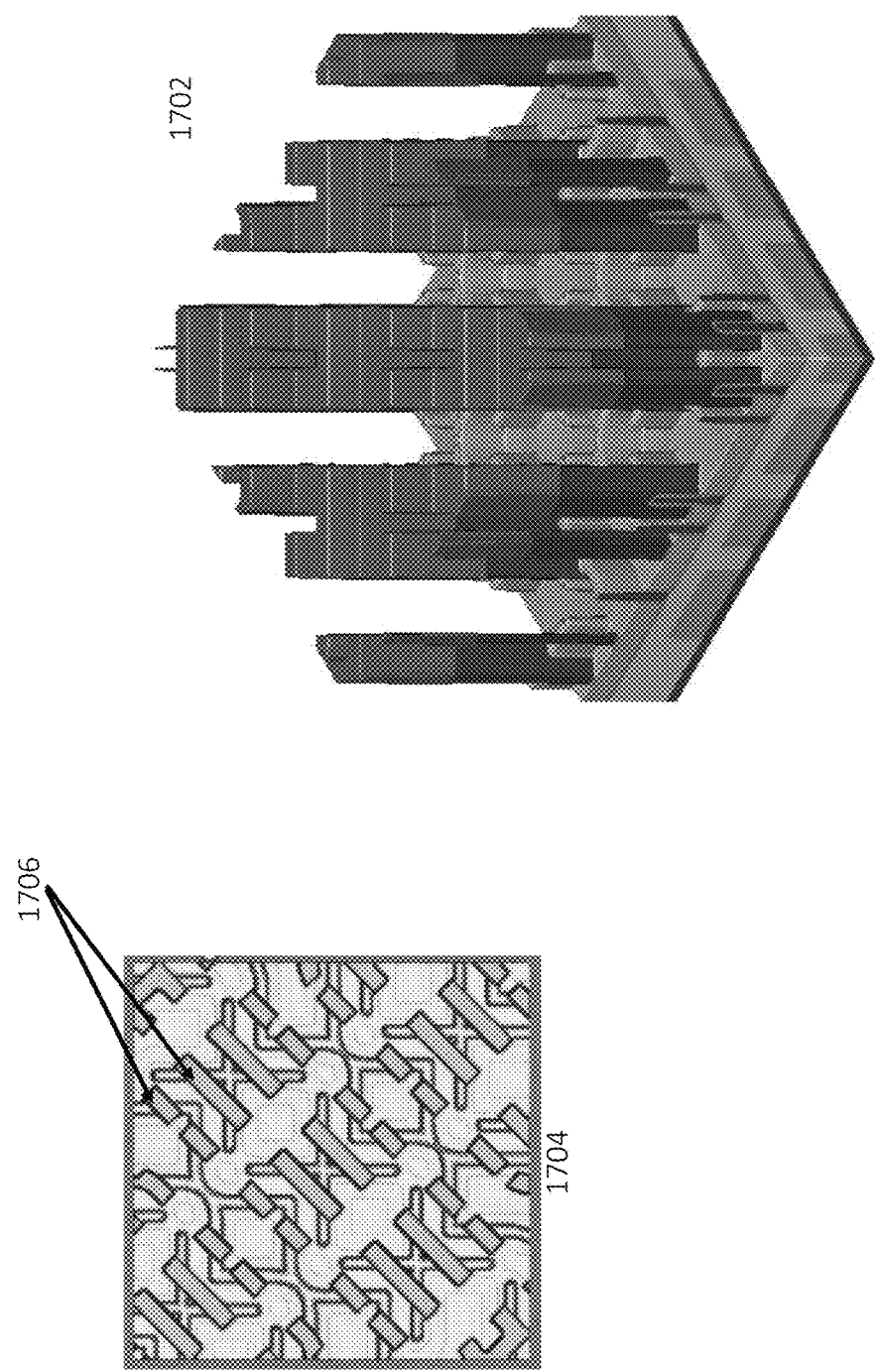
FIG. 17 depicts a result of a gate cut etch step in a fabrication sequence in an exemplary embodiment.

FIG. 17 depicts a result 1702 of a gate cut etch step in a fabrication sequence in an exemplary embodiment. More particularly, the result of an etch transfer from the $2^{nd}$ spacer from SAQP gate patterning for gate formation is shown. As shown in the top view 1704 the gate locations 1706 are positioned 45 degrees to the orthogonal fin pattern. This approach optimizes the quantity of fins underneath one single gate stripe which provides for simplicity in fabrication.

Figure 18:
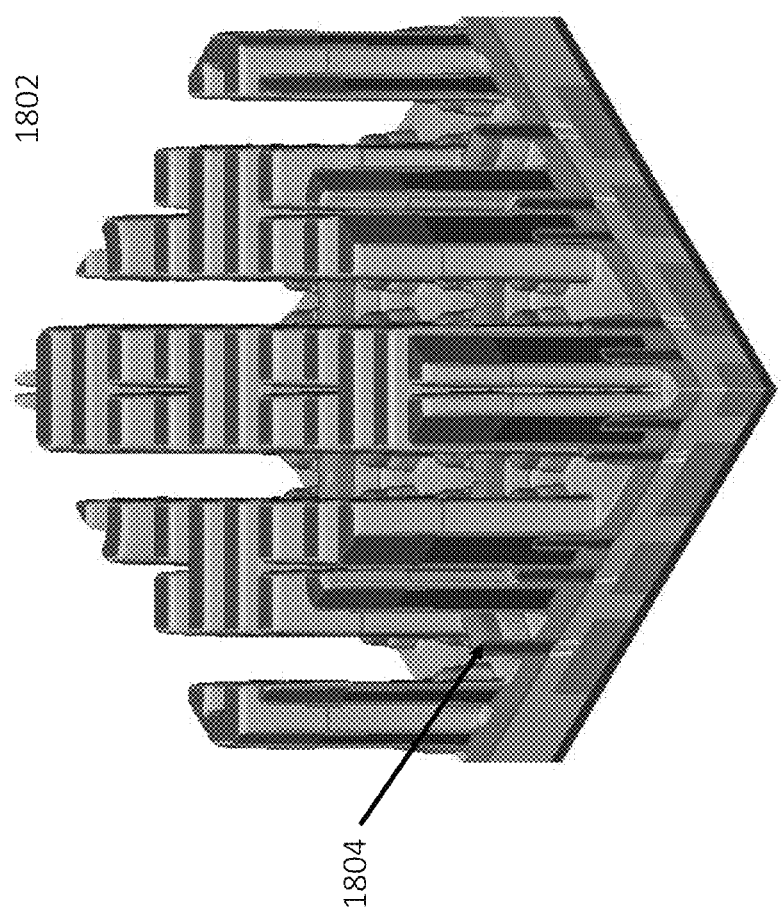
FIG. 18 depicts a result following a gate spacer deposition step and a source/drain epitaxy step in a fabrication sequence in an exemplary embodiment.

FIG. 18 depicts a result 1802 following a gate spacer deposition step that is followed by the performance of Source/Drain epitaxy in a fabrication sequence in an exemplary embodiment. The result 1804 of the Source/Drain epitaxy is depicted.

Figure 19:
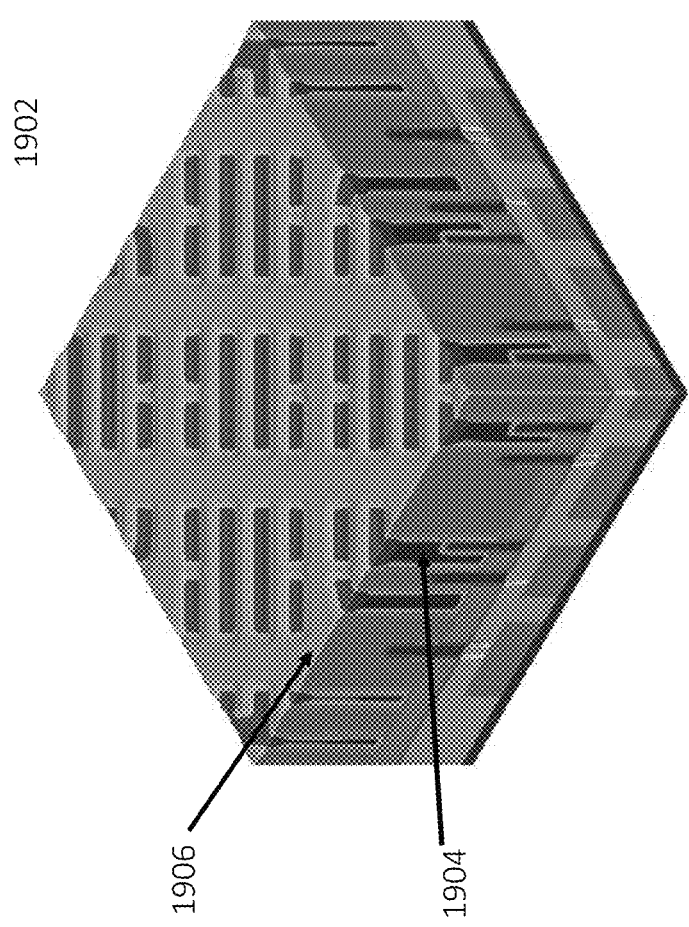
FIG. 19 depicts a result following a replacement metal gate process in a fabrication sequence in an exemplary embodiment.

FIG. 19 depicts a result 1902 following a replacement metal gate process in a fabrication sequence in an exemplary embodiment. The replacement metal gate process replaces dummy gate material with a metal gate. This step results in a gate with correct workfunction metal 1904 and oxide cladding 1906.

Figure 20A:
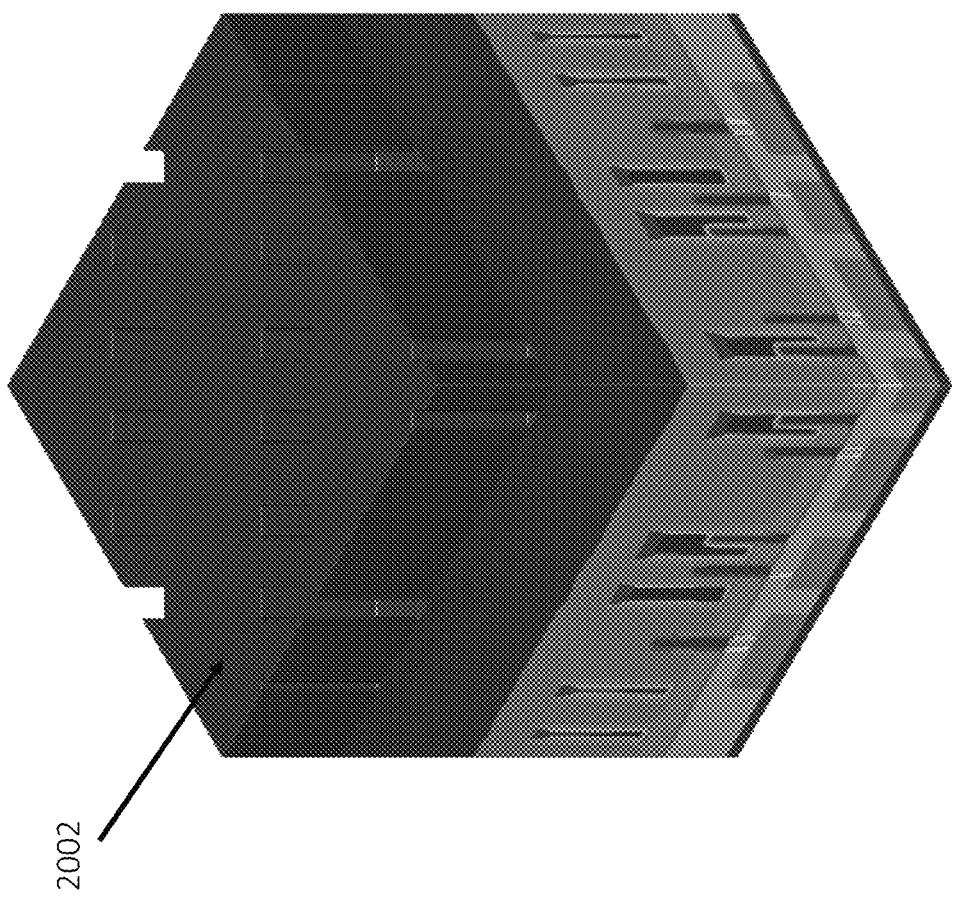
FIG. 20A depicts a photolithography patterning step for contacting sources and drains to gates in a fabrication sequence in an exemplary embodiment.

FIG. 20A depicts a photolithography patterning step in a fabrication sequence in an exemplary embodiment. More particularly, FIG. 20A depicts the litho patterning 2002 that contacts the Source 320s from the first access transistor 320 to the gate 310g of the first storage transistor 310, and contacts the drain 322d from the second access transistor 320 to the gate of the 314g of the third storage transistor 314 (see FIG. 3 for additional view).

FIG. 20B depicts a result 2004 following an etch patterning step for contacting sources/drains to gates performed following the photo lithography step of FIG. 20A in a fabrication sequence in an exemplary embodiment. Cross-section image 2006 provides an x-y view of the contacts in which an opening 2020 allows contacts to the Source/Drain 2022. Top view image 2008 shows a view from above.

Figure 21A:
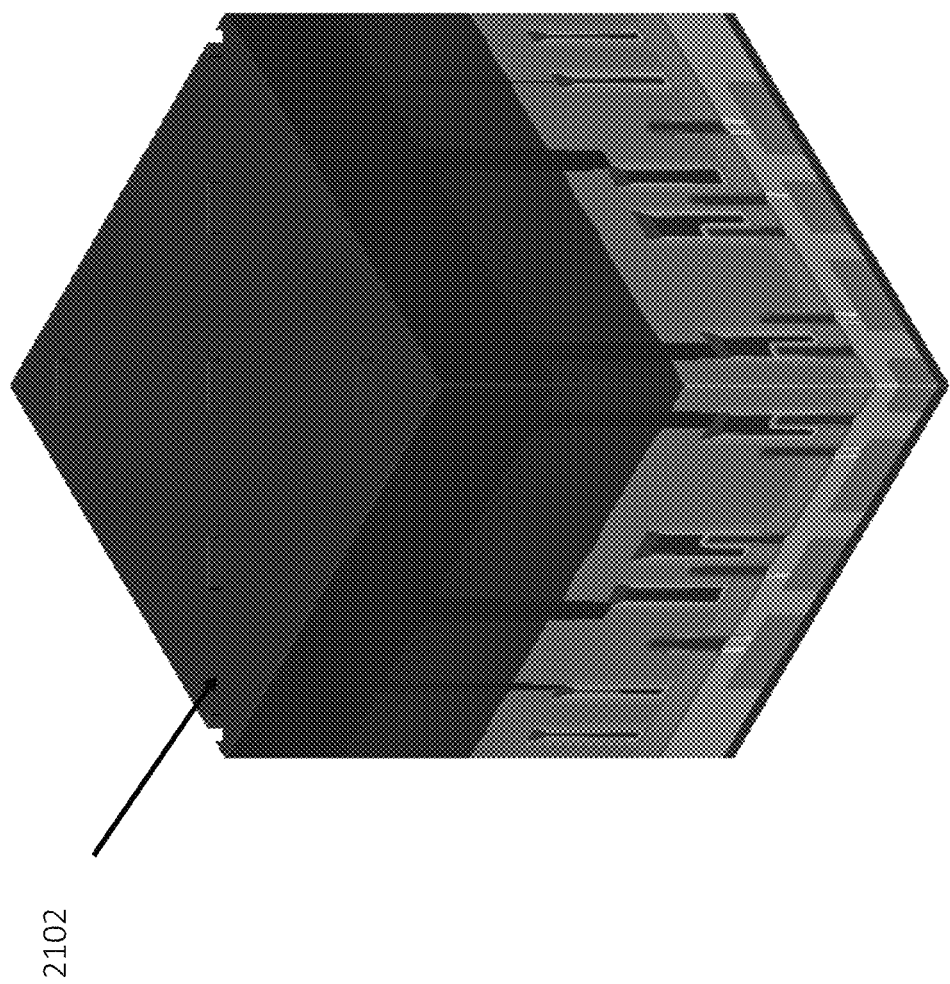
FIG. 21A depicts a photolithography patterning step for contacting vias to GND lines in a fabrication sequence in an exemplary embodiment.

FIG. 21A depicts a photolithography patterning step in a fabrication sequence in an exemplary embodiment. More particularly FIG. 21A depicts the photolithography patterning 2102 that performs resist deposition and patterning (litho) for via contacts to GND lines.

FIG. 21B depicts vias 2104 following an etch patterning step for via contacts to GND lines performed following the lithography step of FIG. 21A in a fabrication sequence in an exemplary embodiment. Cross-section image 2106 provides an x-y view of the contacts in which an opening 2120 allows contacts to the GND 2122 while top view image 2108 shows a view of the vias 2104 from above.

Figure 22A:
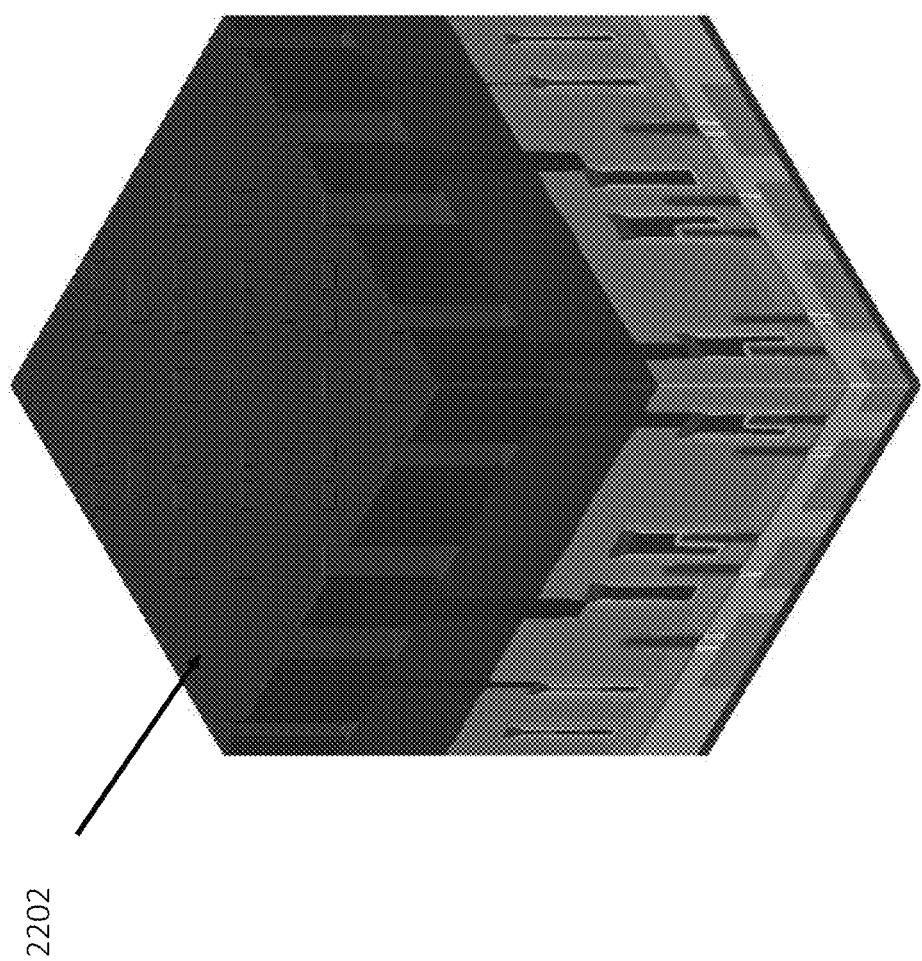
FIG. 22A depicts a view of a deposition and photolithography patterning step to contact vias to sources and drains in a fabrication sequence in an exemplary embodiment.

FIG. 22A depicts a view 2202 of a deposition and photolithography patterning step to contact vias to sources and drains in a fabrication sequence in an exemplary embodiment.

Figure 22B:
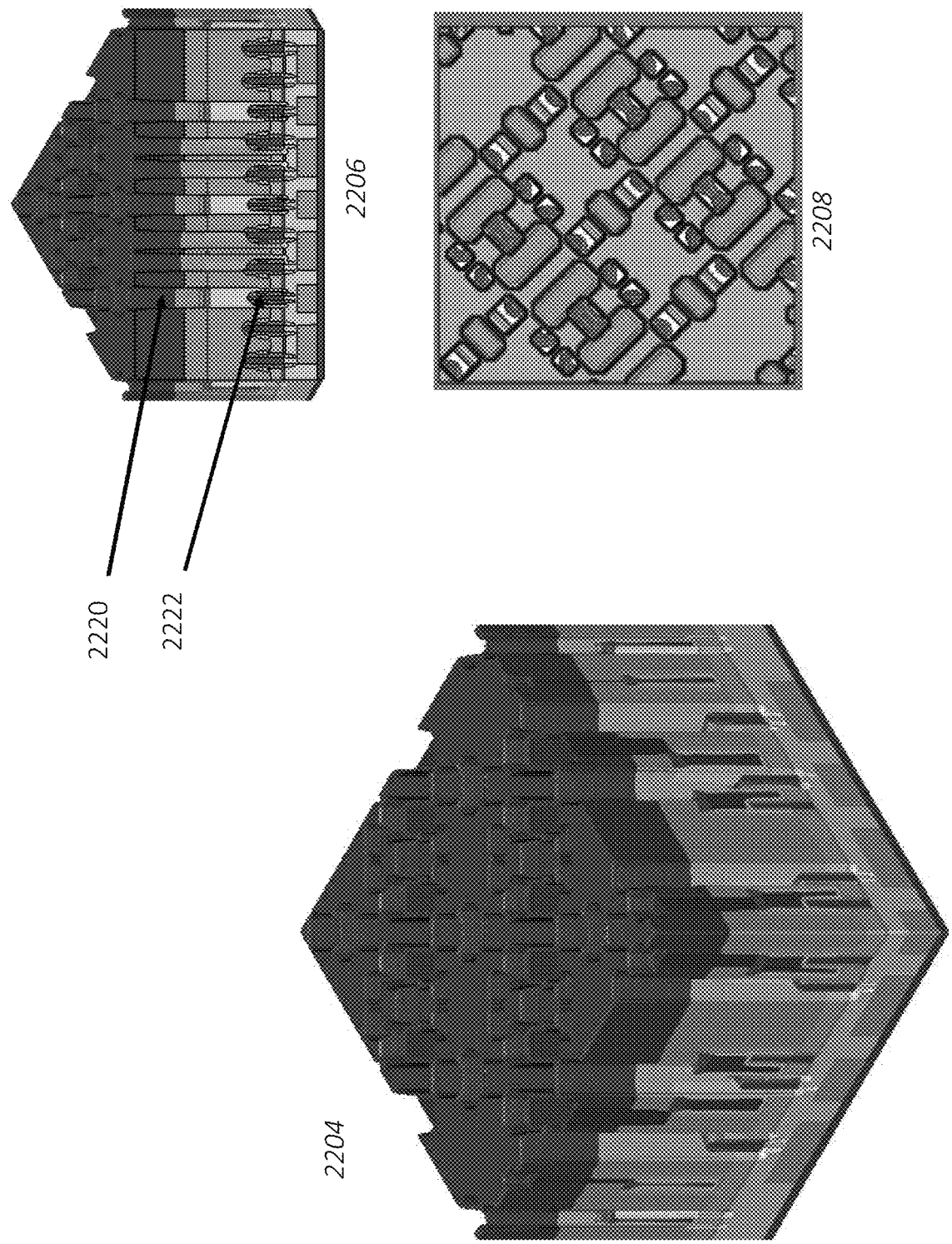
FIG. 22B depicts a result following an etch patterning step for contacting vias to sources and drains performed following the photolithography step of FIG. 21A in a fabrication sequence in an exemplary embodiment.

FIG. 22B depicts a result 2204 following an etch patterning step to contact vias to sources and drains performed following the lithography step of FIG. 22A in a fabrication sequence in an exemplary embodiment. Cross-section image 2206 provides an x-y view of an opening 2220 which allows contacts to the source/drain 2222. Top view image 2208 shows a view from above.

Figure 23:
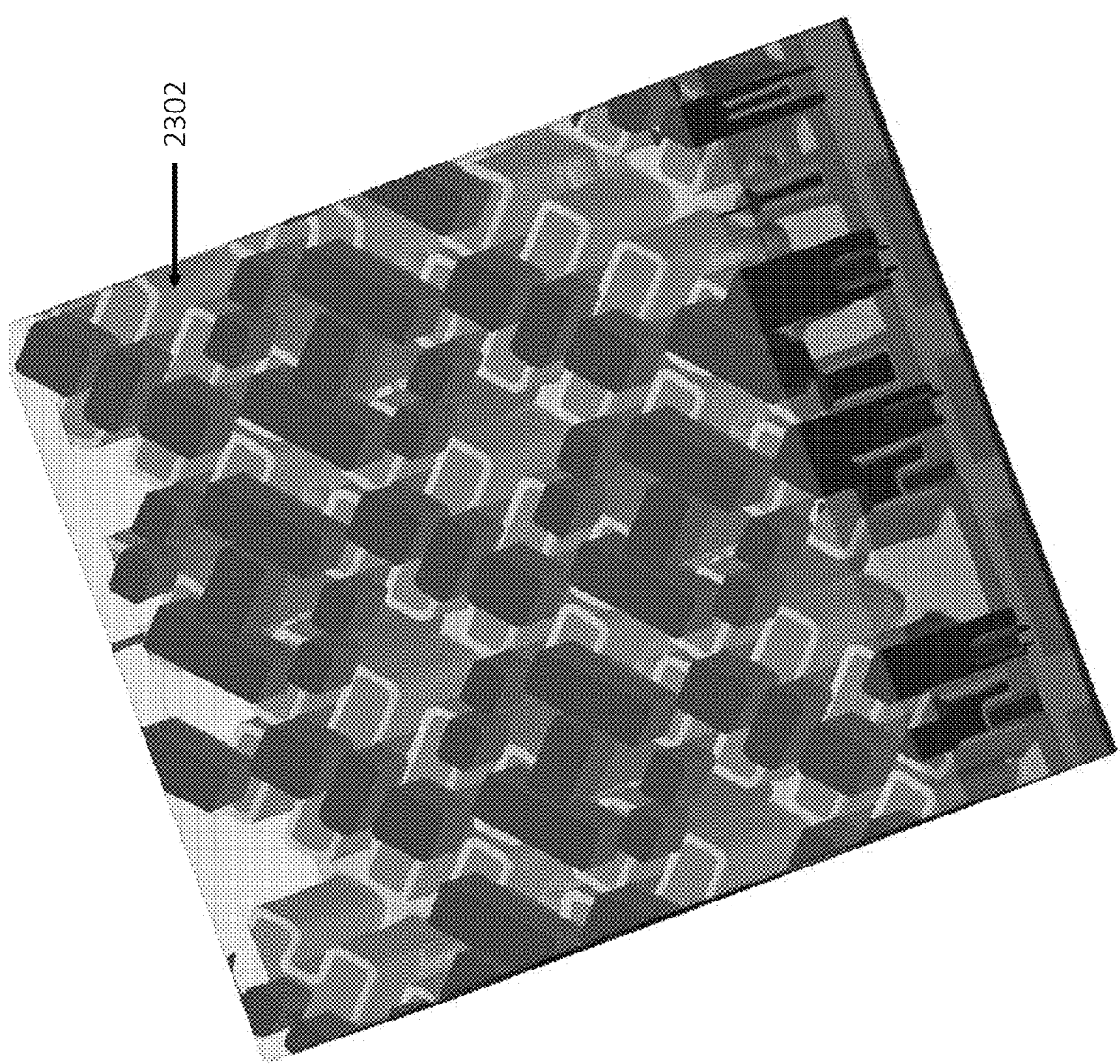
FIG. 23 depicts a deposition and planarization of cladding oxide on the completed first layer in an exemplary embodiment.

FIG. 23 depicts a deposition and planarization of a cladding oxide 2302 on the completed first layer in an exemplary embodiment.

Figure 24:
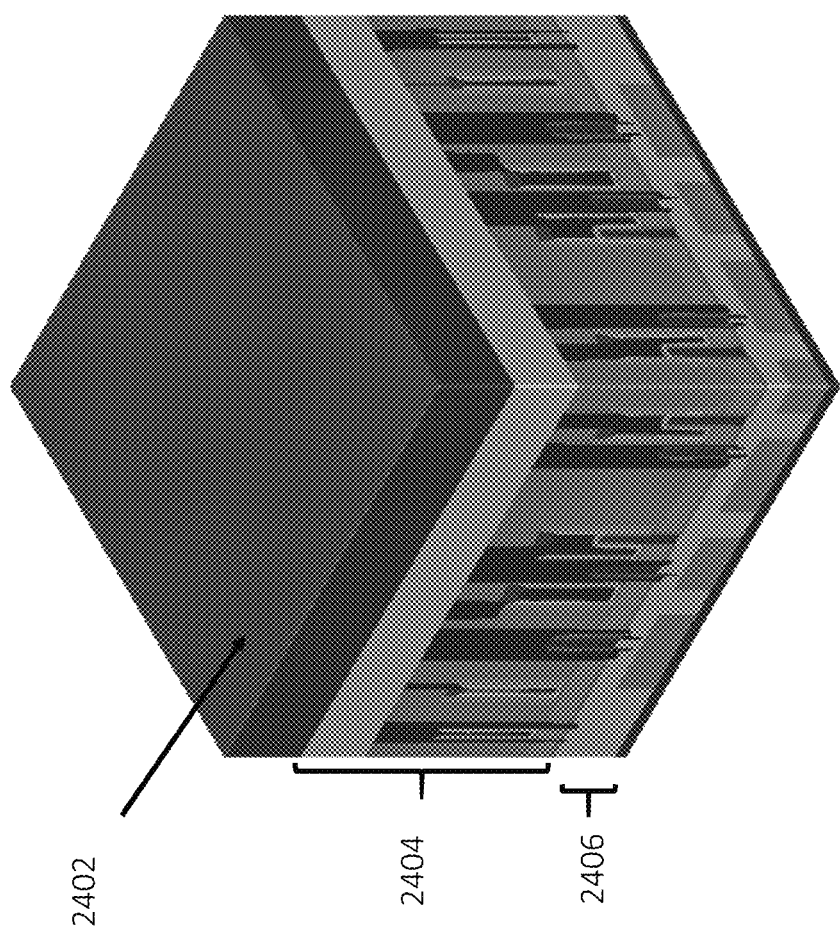
FIG. 24 depicts an oxide cladding and Si layer bonding step performed in a fabrication sequence in an exemplary embodiment.

After the fabrication of the first layer, the sequence continues with the fabrication of the p-FETs on the second layer of memory cell 300. FIG. 24 depicts an oxide cladding and Si layer bonding step performed in a fabrication sequence in an exemplary embodiment. More particularly, an Si layer 2402 is bonded on top of the n-FET wafer 2404 containing the 4 transistors of the same type (n-FET) after oxide cladding and etched back. As discussed above, the n-FET wafer 2404 is located above the buried power rail/layer 0 2406 containing the VDD and GND lines.

Figure 25:
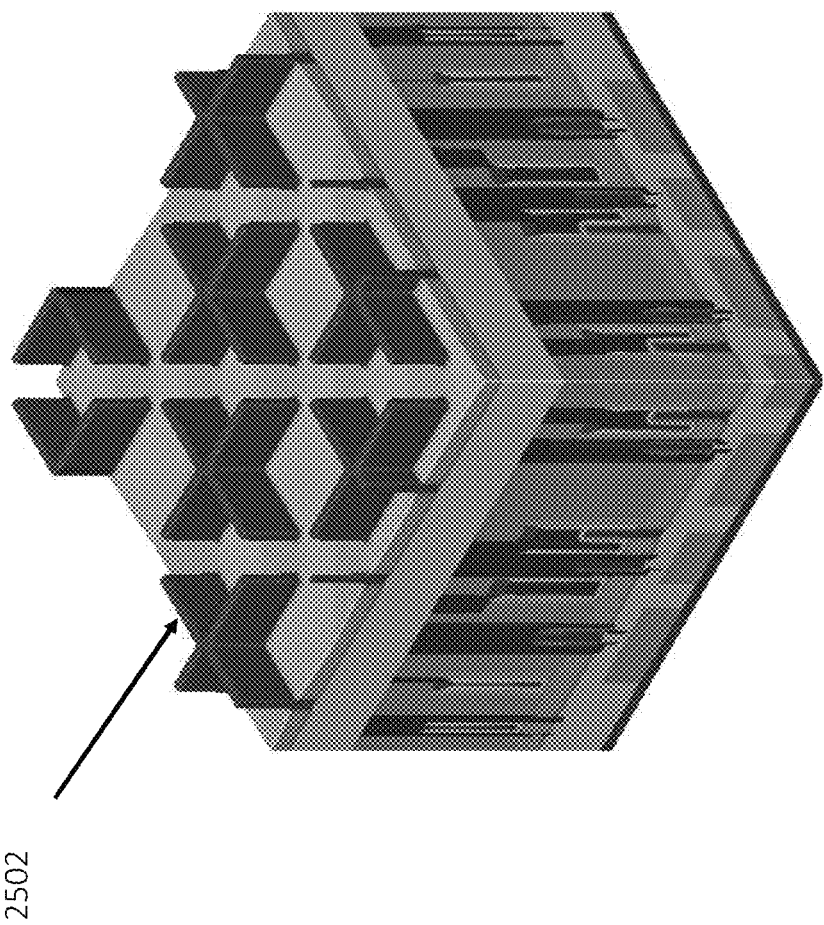
FIG. 25 depicts an SADP fin formation step performed in a fabrication sequence in an exemplary embodiment.

FIG. 25 depicts a result of an SADP fin formation step performed in a fabrication sequence in an exemplary embodiment. More particularly, FIG. 25 depicts a patterned fin array 2502 (a p-FET fin) patterned with resist deposition and photolithography followed by double patterning (spacer deposition, spacer etch and resist removal).

FIG. 26 depicts a result of a gate formation step performed in a fabrication sequence in an exemplary embodiment. A patterned gate array 2602 of p-FET gates patterned with resist deposition and photolithography followed by quadruple patterning is produced by the step and is depicted in FIG. 26. It should be noted that the gates appear at a 45 degree angle to the orthogonal fins as depicted in top view 2604.

Figure 27:
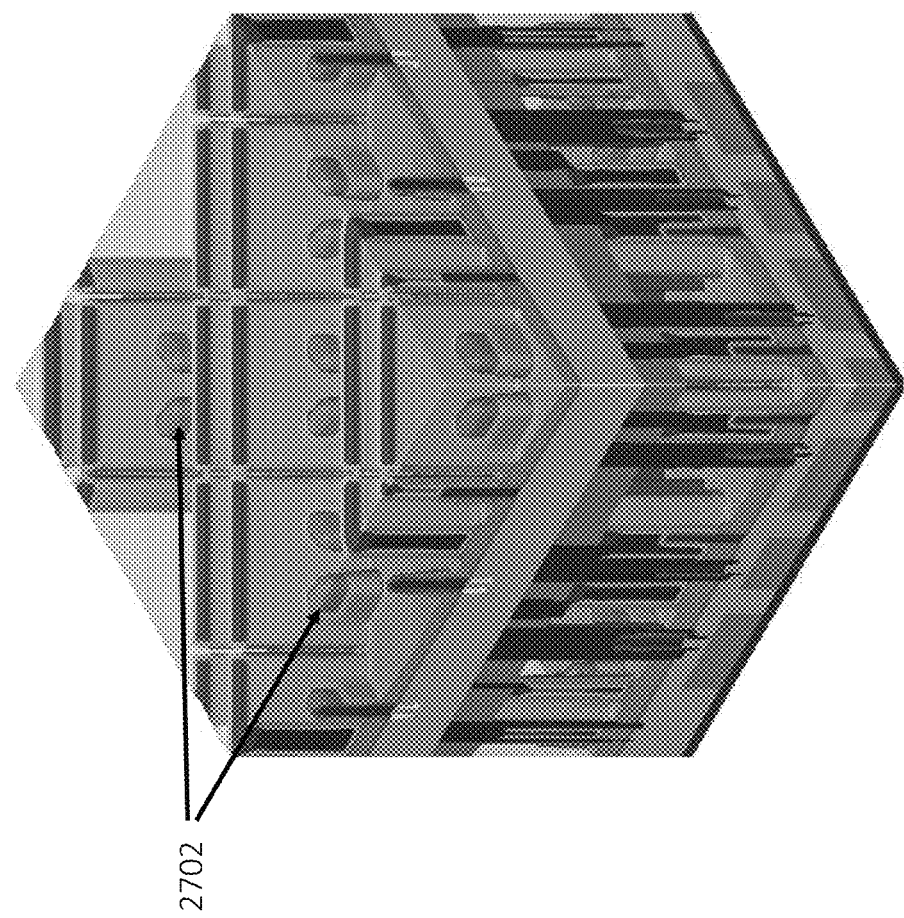
FIG. 27 depicts a result of a gate spacer deposition step followed by a source/drain epitaxy step performed in a fabrication sequence in an exemplary embodiment.

FIG. 27 depicts a result of a gate spacer deposition step followed by a source/drain epitaxy step performed in a fabrication sequence in an exemplary embodiment. An exemplary result of the source/drain epitaxy step is shown at location 2702.

Figure 28A:
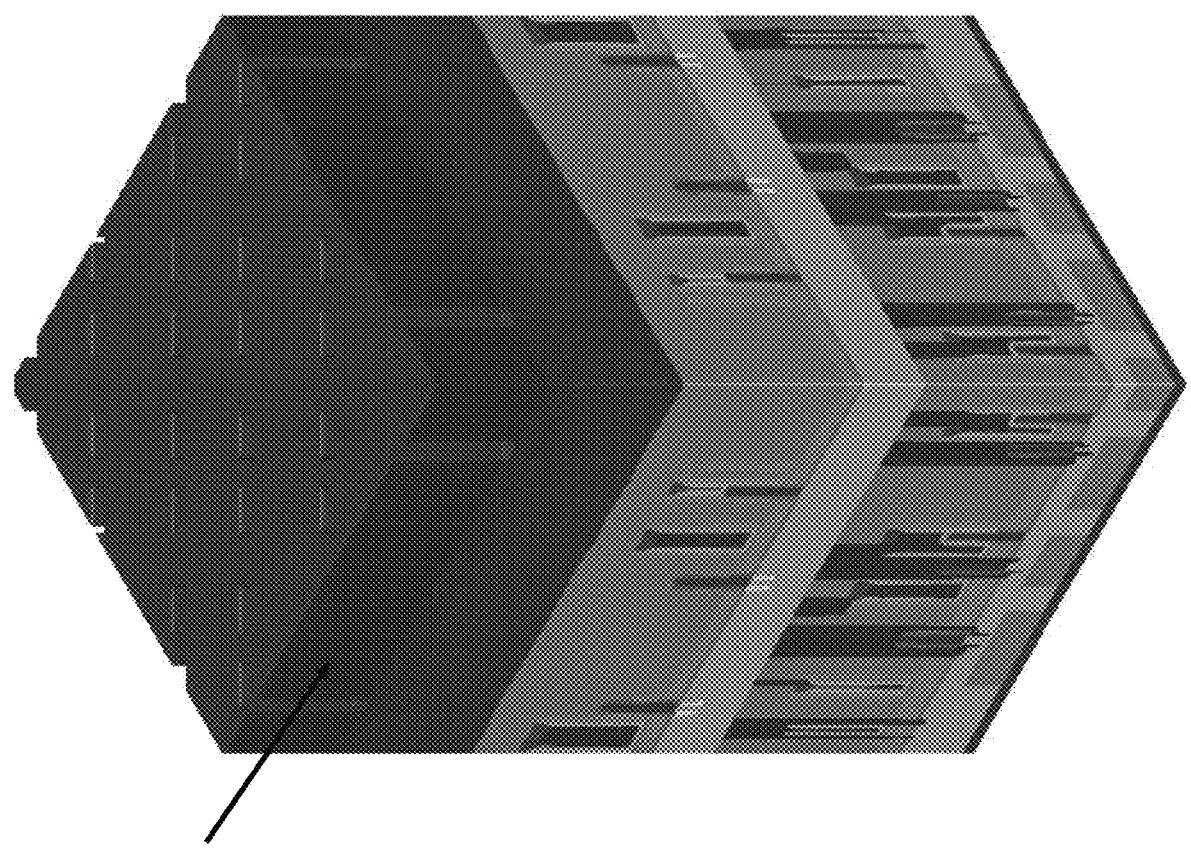
FIG. 28A depicts a view of a resist deposition and patterning (litho) for Metal 0 line formation step performed in a fabrication sequence in an exemplary embodiment.

FIG. 28A depicts a view 2802 of a resist deposition and patterning (litho) for Metal 0 line formation step performed in a fabrication sequence in an exemplary embodiment.

FIG. 28B depicts three views 2810, x-y view 2820 and top view 2830 of a patterning (etch) for Metal 0 line formation step performed in a fabrication sequence in an exemplary embodiment. The x-y view 2820 depicts an opening 2822 for Metal 0 line.

Figure 29A:
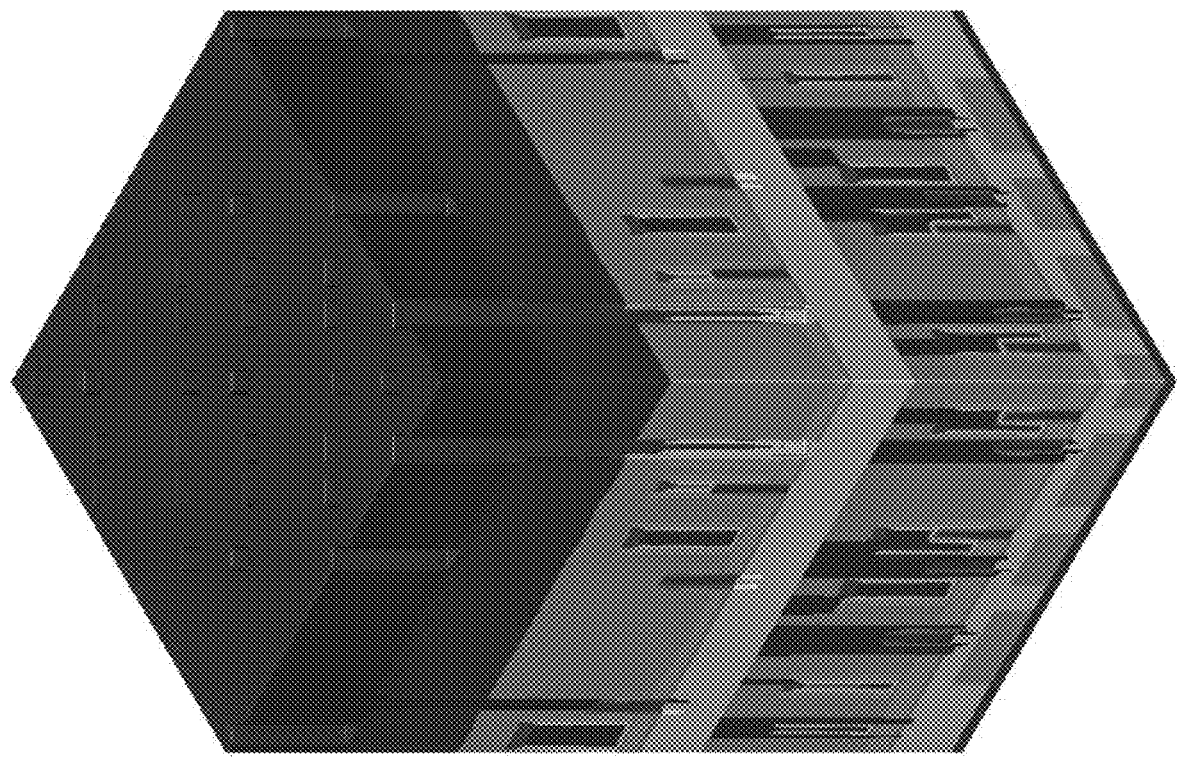
FIG. 29A depicts a photolithography patterning step result for gate to gate contact, source to source contact and drain to drain contact performed in a fabrication sequence in an exemplary embodiment.

FIG. 29A depicts a photolithography patterning step result for gate to gate contact, source to source contact and drain to drain contact performed in a fabrication sequence in an exemplary embodiment. More particularly, FIG. 29 depicts a result of performing a step for p-gate to n-gate contact (312g to 310g and 316g to 314g), p-source to n-source contact (312s to 310s) and p-drain to n-drain (316d-314d) during fabrication of memory cell 300 (see also FIG. 3 for alternate view of connections).

FIG. 29B depicts an etch patterning step for gate to gate contact, source to source contact and drain to drain contact performed following the photolithography step of FIG. 29A in a fabrication sequence in an exemplary embodiment. More particularly, FIG. 29B depicts a result of performing a step for p-gate to n-gate contact (312g to 310g and 316g to 314g), p-source to n-source contact (312s to 310s) and p-drain to n-drain (316d-314d) during fabrication of memory cell 300 (see also FIG. 3 for alternate view of connections). An opening 2920 provides contacts to the bottom gate 2922.

Figure 30A:
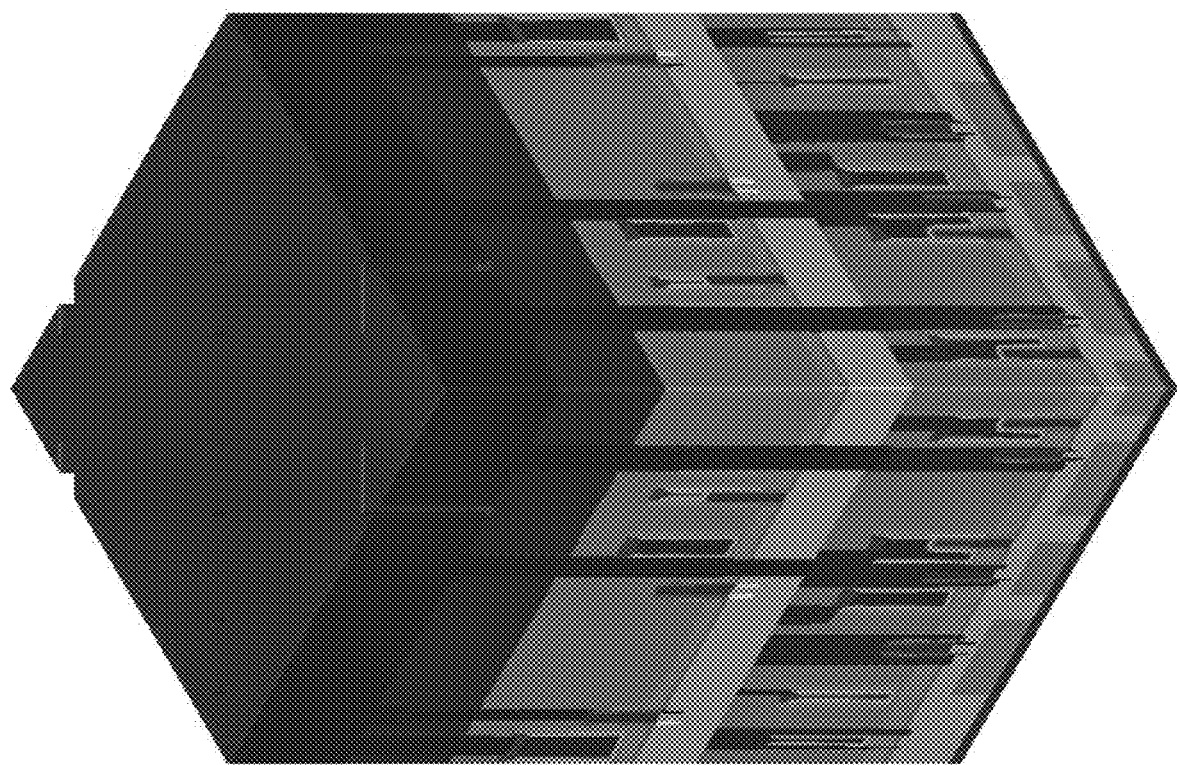
FIG. 30A depicts a view of a result of a photolithography patterning step for via contact to VDD lines performed in a fabrication sequence in an exemplary embodiment.

FIG. 30A depicts a view 3002 of a result of a photolithography patterning step for via contact to VDD lines performed in a fabrication sequence in an exemplary embodiment. Resist deposition and photolithography patterning are performed for via contact to VDD lines.

Figure 30B:
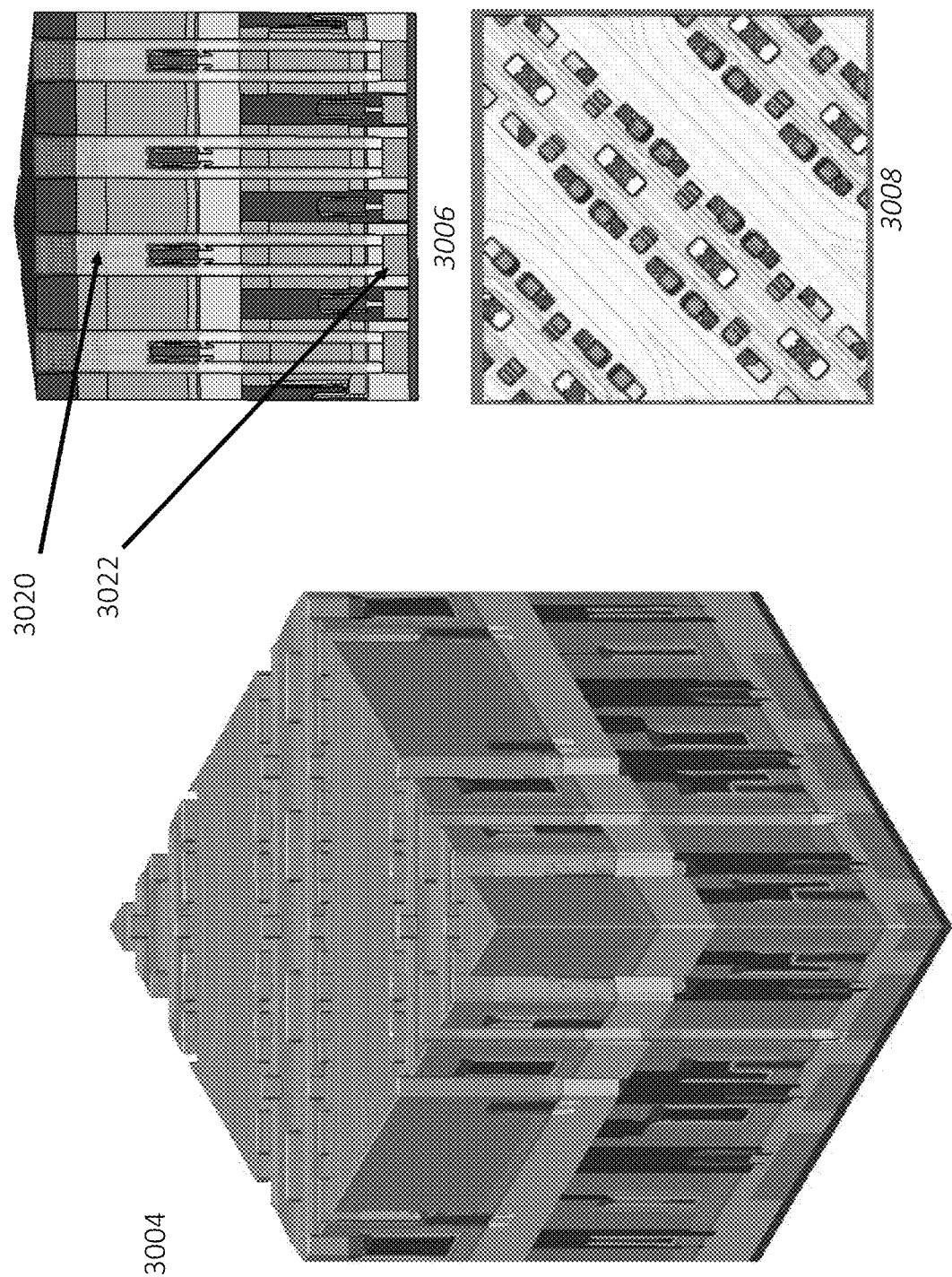
FIG. 30B depicts an etch patterning step for via contact to VDD lines performed following the photolithography step of FIG. 30A in a fabrication sequence in an exemplary embodiment.

FIG. 30B depicts an etch patterning step for via contact to VDD lines performed following the photolithography step of FIG. 30A in a fabrication sequence in an exemplary embodiment. An opening 3022 allows contacts to the VDD line 3024.

Figure 31:
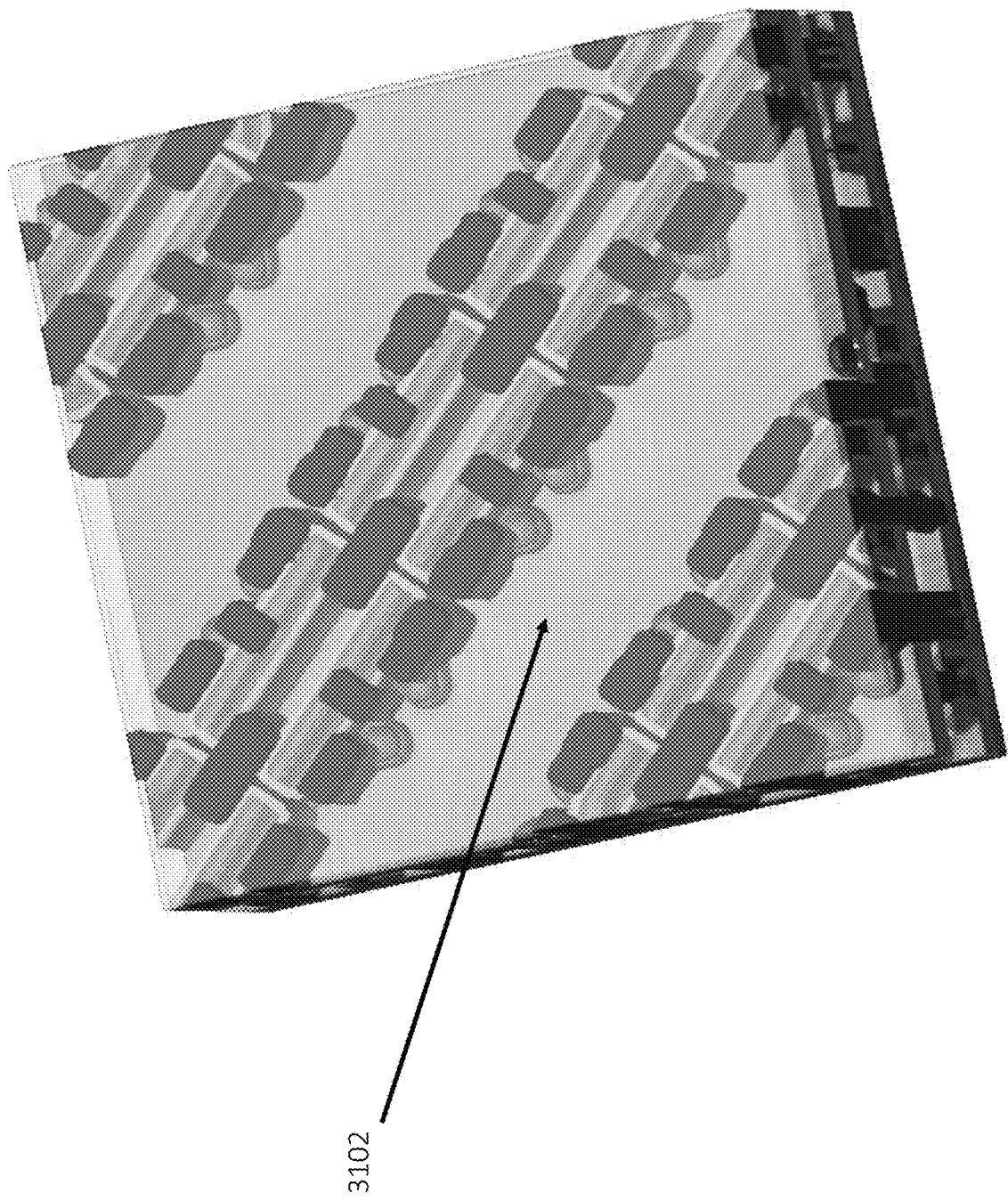
FIG. 31 shows a top view of the completed second layer following a deposition and planarization of a cladding oxide 3120 in an exemplary embodiment.

FIG. 31 shows a top view 3102 of the completed second layer following a deposition and planarization of a cladding oxide 3120 in an exemplary embodiment.

Figure 32:
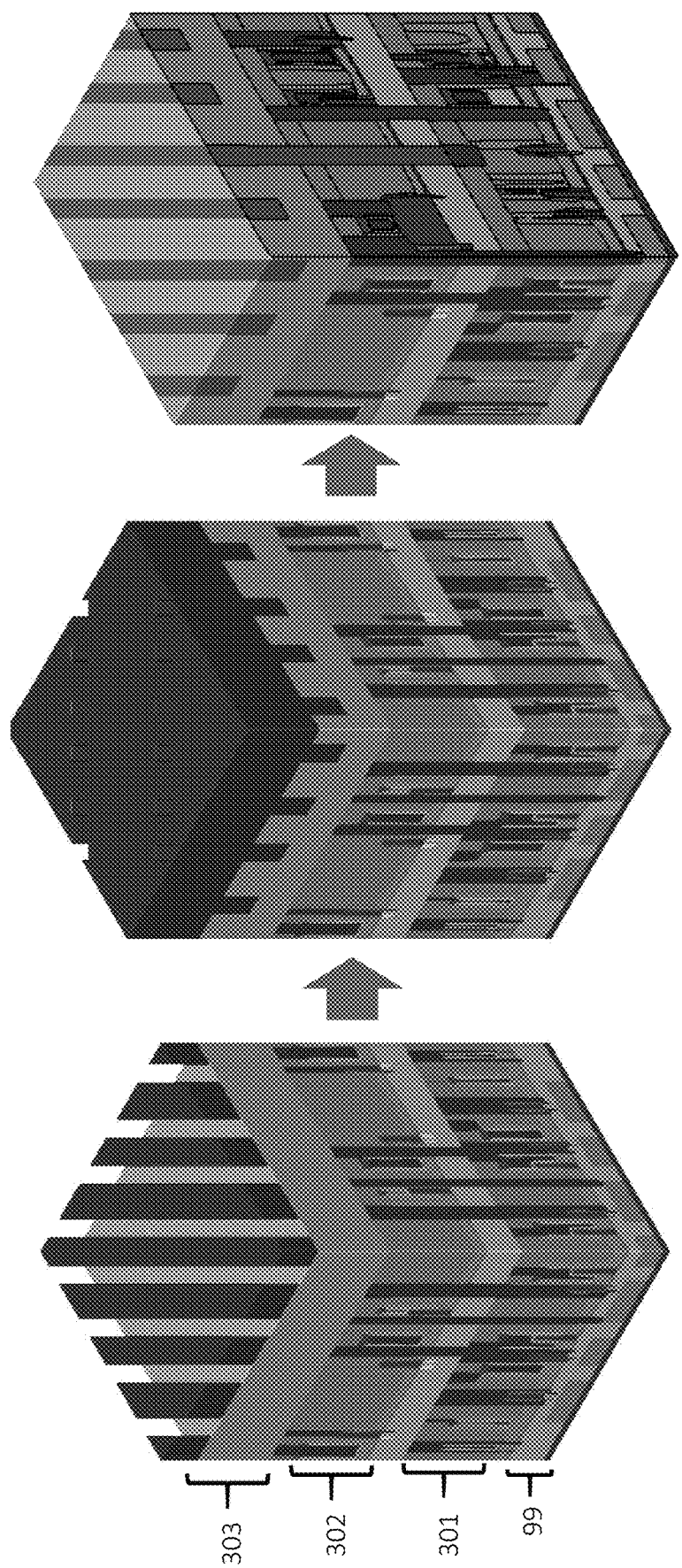
FIG. 32 depicts a line and via patterning step for the third layer in a fabrication sequence in an exemplary embodiment.

Following the completion of the fabrication of the second layer of memory cell 300, fabrication of the third layer of memory cell 300 that includes WL 334 takes place. FIG. 32 depicts a line and via patterning step for the third layer in a fabrication sequence in an exemplary embodiment. More particularly, WL 334 and via patterning is performed for a new layer 3 (303) for memory cell 300 which already includes layer 0/substrate 99, layer 1 (301) with four n-FETs, and layer 3 (302) with two p-FETs. As noted above, in other embodiments, the first layer 301 may instead include four p-FETs and the second layer 302 may include two n-FETs. Word line patterning is followed by via patterning and then metal filling in lines and vias.

Figure 33:
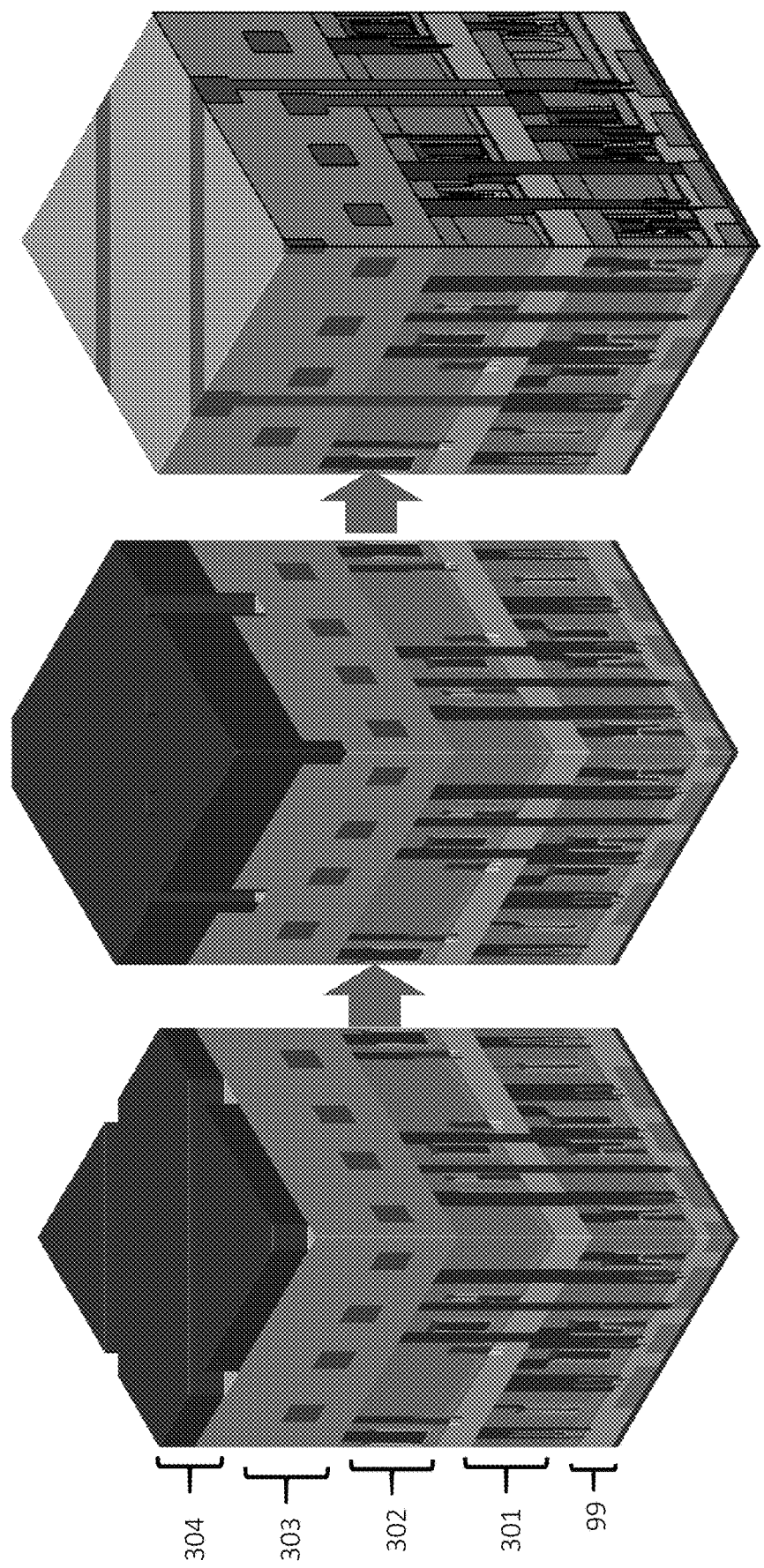
FIG. 33 depicts a line and via patterning step for the fourth layer in a fabrication sequence in an exemplary embodiment.

Following the completion of the fabrication of the third layer 303 of memory cell 300, fabrication of the fourth layer 304 of memory cell 300 that includes BL 336,338 takes place. FIG. 33 depicts a line and via patterning step for the fourth layer in a fabrication sequence in an exemplary embodiment. Bit line patterning is followed by via patterning and then metal filling in lines and vias.

Figure 34:
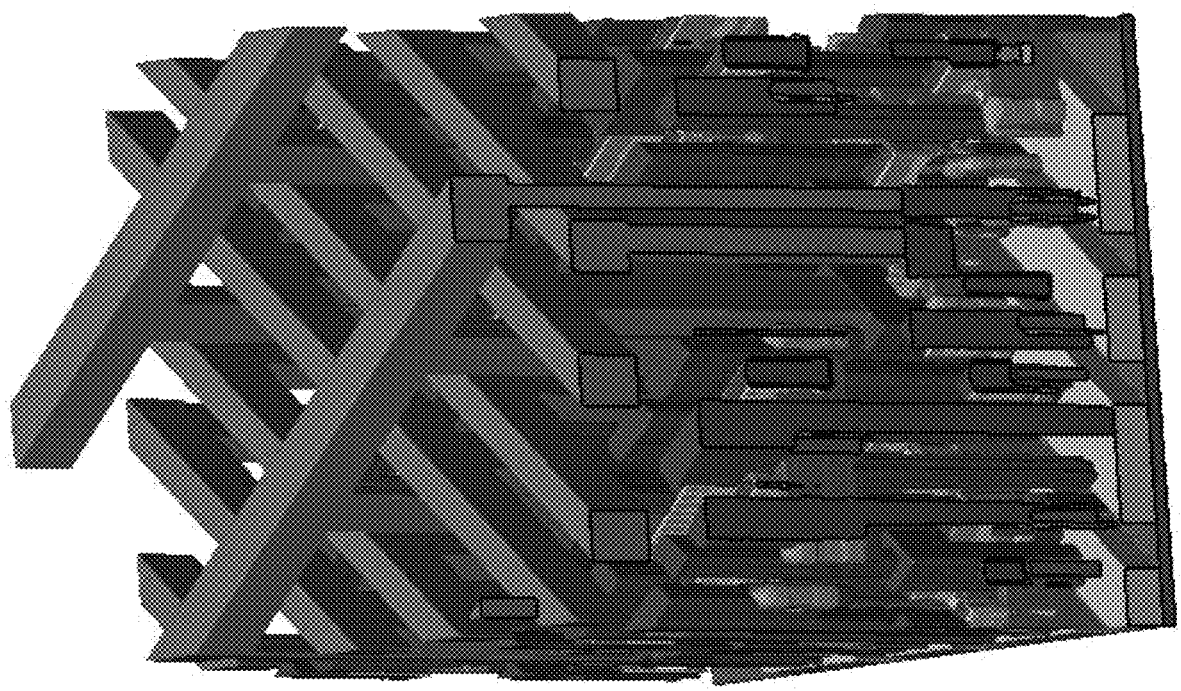
FIG. 34 depicts a via in a final 3D structure of an array of adjacent 6-T Criss-Cross SRAM memory cell in an exemplary embodiment.

FIG. 34 depicts a view in a final 3D structure of an array of adjacent 6-T Criss-Cross SRAM of the design described herein.

FIG. 35 depicts alternate views 3502, 3504, 3506, 3508, 3510 of a unit cell of a 6-T Criss-Cross SRAM of the design described herein. In one embodiment, a cell size is 165×56 nm=0.009 um2.

Figure 36:
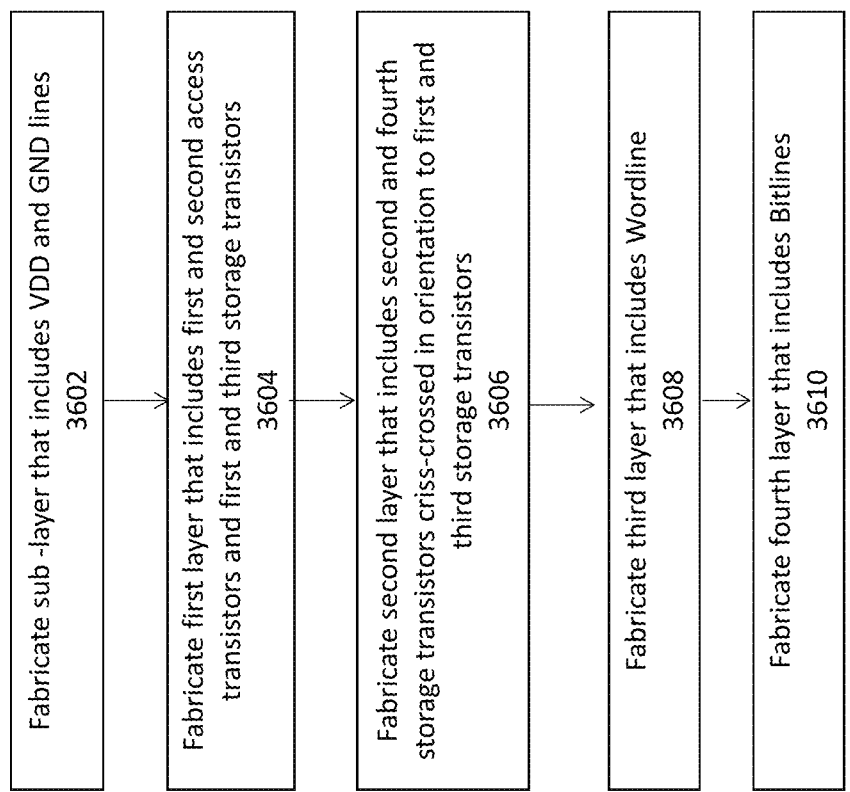
FIG. 36 depicts a sequence of steps for virtually fabricating a 6-T Criss-Cross SRAM memory cell in an exemplary embodiment.

FIG. 36 depicts a sequence of steps for virtually fabricating a 6-T Criss-Cross SRAM memory cell in an exemplary embodiment. The sequence begins with the fabrication of the sub-layer 99 containing a buried power rail containing GND and VDD lines 330, 332 (step 3602). Following the fabrication of the sub-layer 99, a first layer 301 is fabricated (step 3604). As discussed above, the first layer 301 includes the first and second access transistors 320, 322 and first and third storage transistors 310, 314. After the fabrication of the first layer 301, the sequence fabricates the second layer 302 (step 3606). The second layer includes the second and fourth storage transistors 312, 316 which form respective cross-coupled inverters with first and third storage transistors 310, 314. Once fabrication of the second layer 302 is complete, the third layer 303 is fabricated (step 3608). The third layer includes the Wordline 334. Following completion of the third layer 303, the fourth layer 304 is fabricated (step 3610). The fourth layer includes bit lines 336, 338.

In one embodiment, a six transistor Static Random Access Memory (SRAM) cell includes a first and second access transistor located on a first layer, the second access transistor oriented in a direction substantially perpendicular to a direction of the first access transistor. The six transistor SRAM cell further includes a first and second storage transistor forming a first cross-coupled inverter connected to the first access transistor. The first storage transistor is located on the first layer and oriented in a same direction as the first access transistor while the second storage transistor is located on a separate second layer above the first layer and oriented in a direction substantially perpendicular to a direction of the first storage transistor. A midpoint of the second storage transistor is located substantially above a midpoint of the first storage transistor. The six transistor SRAM cell additionally includes a third and fourth storage transistor forming a second cross-coupled inverter connected to the first cross-coupled inverter and the second access transistor. The third storage transistor is located on the first layer and oriented in a direction substantially perpendicular to a direction of the first storage transistor and oriented in a same direction as the second access transistor. The fourth storage transistor is located on the second layer and oriented in a direction substantially perpendicular to a direction of the third storage transistor. A midpoint of the fourth storage transistor is located substantially above a midpoint of the third storage transistor. The first and second access transistors and the first, second, third and fourth storage transistors each include a source located at a first end, a drain located at a second end, and a gate located at an approximate mid-point. The six transistor SRAM cell further includes a word line connected to the gates of the first and second access transistors and a first bit line connected to a drain of the first access transistor and a second bit line connected to the source of the second access transistor. Additionally, the six transistor SRAM cell includes a Voltage Drain (VDD) line submerged in a substrate on a sublayer located beneath the first layer and connected to at least one of a source and drain on the second layer and a ground (GND) line submerged in the substrate beneath the first layer and connected to at least one of a source and drain on the first layer.

In another embodiment, a method of fabricating a six transistor Static Random Access Memory (SRAM) cell, includes fabricating a sublayer that includes a Voltage Drain Drain (VDD) line and a ground (GND) line buried in a substrate. The method further includes fabricating a first layer above the sublayer that includes a first and second access transistor and a first and third storage transistor. The second access transistor is oriented in a direction substantially perpendicular to a direction of the first access transistor. The first storage transistor is oriented in a same direction as the first access transistor and oriented in a direction substantially perpendicular to a direction of the third storage transistor. The third storage transistor is oriented in a same direction as the second access transistor. The method additionally includes fabricating a second layer above the first layer that includes a second and fourth storage transistor. The second storage transistor is oriented in a direction substantially perpendicular to a direction of the fourth storage transistor. The first and second storage transistor form a first cross-coupled inverter connected to the first access transistor in which the second storage transistor is oriented in a direction substantially perpendicular to a direction of the first storage transistor. A midpoint of the second storage transistor is located substantially above a midpoint of the first storage transistor. The third and fourth storage transistor form a second cross-coupled inverter connected to the first cross-coupled inverter and the second access transistor. The fourth storage transistor is oriented in a direction substantially perpendicular to a direction of the third storage transistor. A midpoint of the fourth storage transistor is located substantially above a midpoint of the third storage transistor. The first and second access transistors and the first, second, third and fourth storage transistors each include a source located at a first end, a drain located at a second end, and a gate located at an approximate mid-point. The VDD line is connected to at least one of a source and drain on the second layer and the GND line is connected to at least one of a source and drain on the first layer. Additionally the method also includes fabricating a third layer above the second layer that contains a word line connected to the gates of the first and second access transistors. The method also includes fabricating a fourth layer above the third layer that contains a first bit line connected to a drain of the first access transistor and a second bit line connected to the source of the second access transistor.

Although the description herein has focused on six transistor SRAM memory cells it should be appreciated that in other embodiments other numbers of transistors such as, but not limited to, four, eight or ten transistors, may be used in a memory cell utilizing the criss-cross design described herein without departing from the scope of the present invention. Further while fabrication of the illustrative memory cell 300 has been described with reference to the use of FinFETs, it should be appreciated that other approaches may be used to produce the memory cell in place of FinFETs including, but not limited to, nanowire FETs, nanosheet FETs, stacked nanowire FETs or stacked nanosheet FETs.

It should be appreciated that although the description herein has focused on SRAM memory cell design, the concepts discussed, such as but not limited to the use of criss-crossed transistors within a three dimensional cross-coupled inverter, may also be extended to encompass other types of memory cells without departing the scope of the present invention.

The foregoing description of example embodiments of the invention provides illustration and description, but is not intended to be exhaustive or to limit the invention to the precise form disclosed. Modifications and variations are possible in light of the above teachings or may be acquired from practice of the invention. For example, while a series of acts has been described, the order of the acts may be modified in other implementations consistent with the principles of the invention. Further, non-dependent acts may be performed in parallel.

Since certain changes may be made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

We claim:

1. A six transistor Static Random Access Memory (SRAM) cell, comprising:
    a first and second access transistor located on a first layer, the second access transistor oriented in a direction substantially perpendicular to a direction of the first access transistor;
    a first and second storage transistor forming a first cross-coupled inverter connected to the first access transistor, the first storage transistor located on the first layer and oriented in a same direction as the first access transistor, the second storage transistor located on a separate second layer above the first layer and oriented in a direction substantially perpendicular to a direction of the first storage transistor, a midpoint of the second storage transistor located substantially above a midpoint of the first storage transistor;
    a third and fourth storage transistor forming a second cross-coupled inverter connected to the first cross-coupled inverter and the second access transistor, the third storage transistor located on the first layer and oriented in a direction substantially perpendicular to a direction of the first storage transistor and oriented in a same direction as the second access transistor, the fourth storage transistor located on the second layer and oriented in a direction substantially perpendicular to a direction of the third storage transistor, a midpoint of the fourth storage transistor located substantially above a midpoint of the third storage transistor, wherein the first and second access transistors and the first, second, third and fourth storage transistors each include a source located at a first end, a drain located at a second end, and a gate located at an approximate mid-point;
    a word line connected to the gates of the first and second access transistors;
    a first bit line connected to a drain of the first access transistor and a second bit line connected to the source of the second access transistor;
    a Voltage Drain Drain (VDD) line submerged in a substrate on a sublayer located beneath the first layer and connected to at least one of a source and drain on the second layer; and
    a ground (GND) line submerged in the substrate beneath the first layer and connected to at least one of a source and drain on the first layer.

2. The SRAM cell of claim 1 wherein the first and second access transistors and the first, second, third and fourth storage transistors are Metal Oxide Semiconductor Field-Effect Transistors (MOSFETs).

3. The SRAM cell of claim 2 wherein the first and second access transistors and the first and third storage transistors are n-channel MOSFETs and the second and fourth storage transistors are p-channel MOSFETs.

4. The SRAM cell of claim 2 wherein the first and second access transistors and the first and third storage transistors are p-channel MOSFETs and the second and fourth storage transistors are n-channel MOSFETs.

5. The SRAM cell of claim 1 wherein one or more of the first and second access transistors and the first, second, third and fourth storage transistors are nanosheet Field-Effect Transistors (FETs) or stacked nanosheet FETs.

6. The SRAM cell of claim 1 wherein one or more of the first and second access transistors and the first, second, third and fourth storage transistors are nanowire Field-Effect Transistors (FETs) or stacked nanowire FETs.

7. The SRAM cell of claim 1 wherein a drain of the first storage transistor and a source of the third storage transistor form a merged source and drain on the first layer.

8. The SRAM cell of claim 1 wherein a drain of the second storage transistor and a source of the fourth storage transistor form a second merged source and drain on the second layer.

9. The SRAM cell of claim 8 wherein a drain of the first storage transistor and a source of the third storage transistor form a merged source and drain on the first layer.

10. A method of fabricating a six transistor Static Random Access Memory (SRAM) cell, comprising:
    fabricating a sublayer that includes a Voltage Drain Drain (VDD) line and a ground (GND) line buried in a substrate;
    fabricating a first layer above the sublayer that includes a first and second access transistor and a first and third storage transistor, the second access transistor oriented in a direction substantially perpendicular to a direction of the first access transistor, the first storage transistor oriented in a same direction as the first access transistor and oriented in a direction substantially perpendicular to a direction of the third storage transistor, the third storage transistor oriented in a same direction as the second access transistor;
    fabricating a second layer above the first layer that includes a second and fourth storage transistor, the second storage transistor oriented in a direction substantially perpendicular to a direction of the fourth storage transistor,
    wherein the first and second storage transistor form a first cross-coupled inverter connected to the first access transistor, the second storage transistor oriented in a direction substantially perpendicular to a direction of the first storage transistor, a midpoint of the second storage transistor located substantially above a midpoint of the first storage transistor, wherein the third and fourth storage transistor form a second cross-coupled inverter connected to the first cross-coupled inverter and the second access transistor, the fourth storage transistor oriented in a direction substantially perpendicular to a direction of the third storage transistor, a midpoint of the fourth storage transistor located substantially above a midpoint of the third storage transistor, wherein the first and second access transistors and the first, second, third and fourth storage transistors each include a source located at a first end, a drain located at a second end, and a gate located at an approximate mid-point, and wherein the VDD line is connected to at least one of a source and drain on the second layer and the GND line is connected to at least one of a source and drain on the first layer;

fabricating a third layer above the second layer containing a word line connected to the gates of the first and second access transistors; and fabricating a fourth layer above the third layer containing a first bit line connected to a drain of the first access transistor and a second bit line connected to the source of the second access transistor.

11. The method of claim 10 wherein the first and second layer are fabricated using orthogonal line patterning to produce fins for the first and second access transistors and the first, second, third and fourth storage transistors.

12. The method of claim 11, further comprising:
fabricating the gates of the first and second access transistors and the first, second, third and fourth storage transistors at an approximate 45 degree angle to the fins.

13. The method of claim 10 wherein the first and second access transistors and the first, second, third and fourth storage transistors are Metal Oxide Semiconductor Field-Effect Transistors (MOSFETs).

14. The method of claim 13 wherein the first and second access transistors and the first and third storage transistors are n-channel MOSFETs and the second and fourth storage transistors are p-channel MOSFETs.

15. The method of claim 13 wherein the first and second access transistors and the first and third storage transistors are p-channel MOSFETs and the second and fourth storage transistors are n-channel MOSFETs.

16. The method of claim 10 wherein one or more of the first and second access transistors and the first, second, third and fourth storage transistors are nanosheet Field-Effect Transistors (FETs) or stacked nanosheet FETs.

17. The method of claim 10 wherein one or more of the first and second access transistors and the first, second, third and fourth storage transistors are nanowire Field-Effect Transistors (FETs) or stacked nanowire FETs.

* * * * *